(12) United States Patent
Ueno

(10) Patent No.: US 9,571,011 B2
(45) Date of Patent: Feb. 14, 2017

(54) POWER GENERATING ELEMENT AND POWER GENERATION DEVICE

(75) Inventor: Toshiyuki Ueno, Ishikawa (JP)

(73) Assignee: NATIONAL UNIVERSITY CORPORATION KANAZAWA UNIVERSITY, Ishikawa (JP)

( * ) Notice: Subject to any disclaimer, the term of this patent is extended or adjusted under 35 U.S.C. 154(b) by 529 days.

(21) Appl. No.: 14/345,027

(22) PCT Filed: Sep. 13, 2012

(86) PCT No.: PCT/JP2012/005854
§ 371 (c)(1),
(2), (4) Date: Mar. 14, 2014

(87) PCT Pub. No.: WO2013/038682
PCT Pub. Date: Mar. 21, 2013

(65) Prior Publication Data
US 2014/0346902 A1    Nov. 27, 2014

(30) Foreign Application Priority Data

Sep. 16, 2011    (JP) .................................. 2011-203797

(51) Int. Cl.
*H02N 2/18* (2006.01)
*H01L 41/12* (2006.01)

(52) U.S. Cl.
CPC ............ *H02N 2/186* (2013.01); *H01L 41/125* (2013.01)

(58) Field of Classification Search
CPC ............................. H01L 41/125; H02N 2/186
USPC .................................................. 310/339, 326
See application file for complete search history.

(56) References Cited

U.S. PATENT DOCUMENTS

| 4,784,003 A | 11/1988 | Kimura et al. |
| 4,985,108 A | 1/1991 | Kimura et al. |

FOREIGN PATENT DOCUMENTS

| JP | 63-69283 | 3/1988 |
| JP | 4-121629 | 4/1992 |
| JP | 9-90065 | 4/1997 |
| JP | 2004-282953 | 10/2004 |
| JP | 2005-331450 | 12/2005 |
| JP | 2006-166694 | 6/2006 |
| JP | 2008-72862 | 3/2008 |

OTHER PUBLICATIONS

International Search Report issued Dec. 11, 2012 in corresponding International Application No. PCT/JP2012/005854.
Hiroshi Hosaka, "Vibration Power-Generation Technologies for Wearable Information Devices", IEEJ Journal, vol. 126, No. 4, 2006 (with English translation).

(Continued)

*Primary Examiner* — Thomas Dougherty
*Assistant Examiner* — Karen B Addison
(74) *Attorney, Agent, or Firm* — Wenderoth, Lind & Ponack, L.L.P.

(57) ABSTRACT

The present disclosure includes: a magnetostrictive plate including a magnetostrictive material; a yoke around which a coil is wound and which has two ends magnetically connected to a surface of the magnetostrictive plate; and a bias magnet that generates bias magnetic flux circulating from one of the two ends of the yoke to the other one of the two ends through the yoke. Here, the magnetostrictive plate is surface-bonded to a non-magnetic structural body.

10 Claims, 20 Drawing Sheets

(56) References Cited

OTHER PUBLICATIONS

T. Ueno et al., "Study on Micro-energy Harvesting Device Using Iron—Gallium Alloy", Journal of the Magnetics Society of Japan, vol. 35, No. 2, Feb. 4, 2011, pp. 88-91 (with English translation).

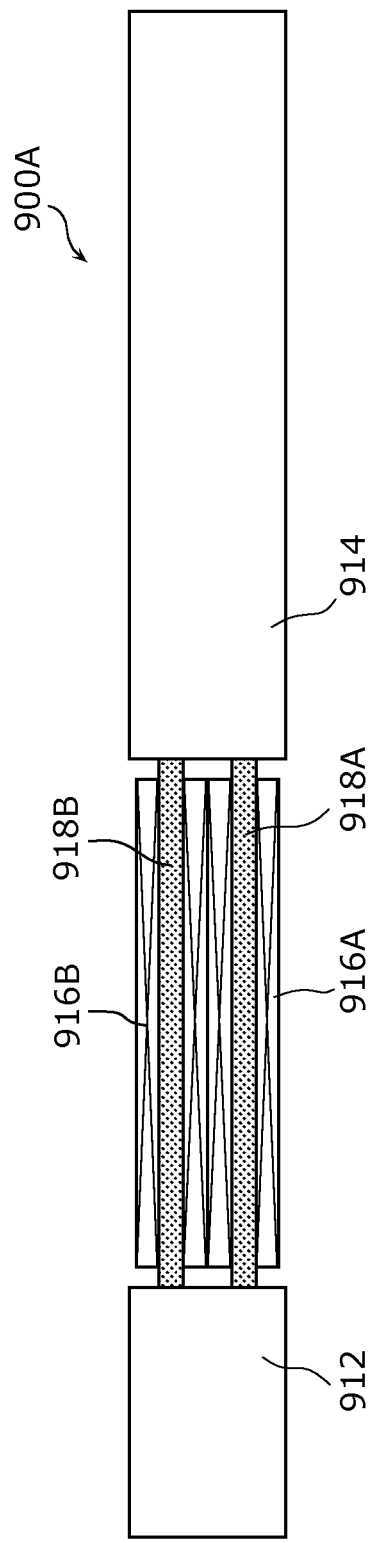

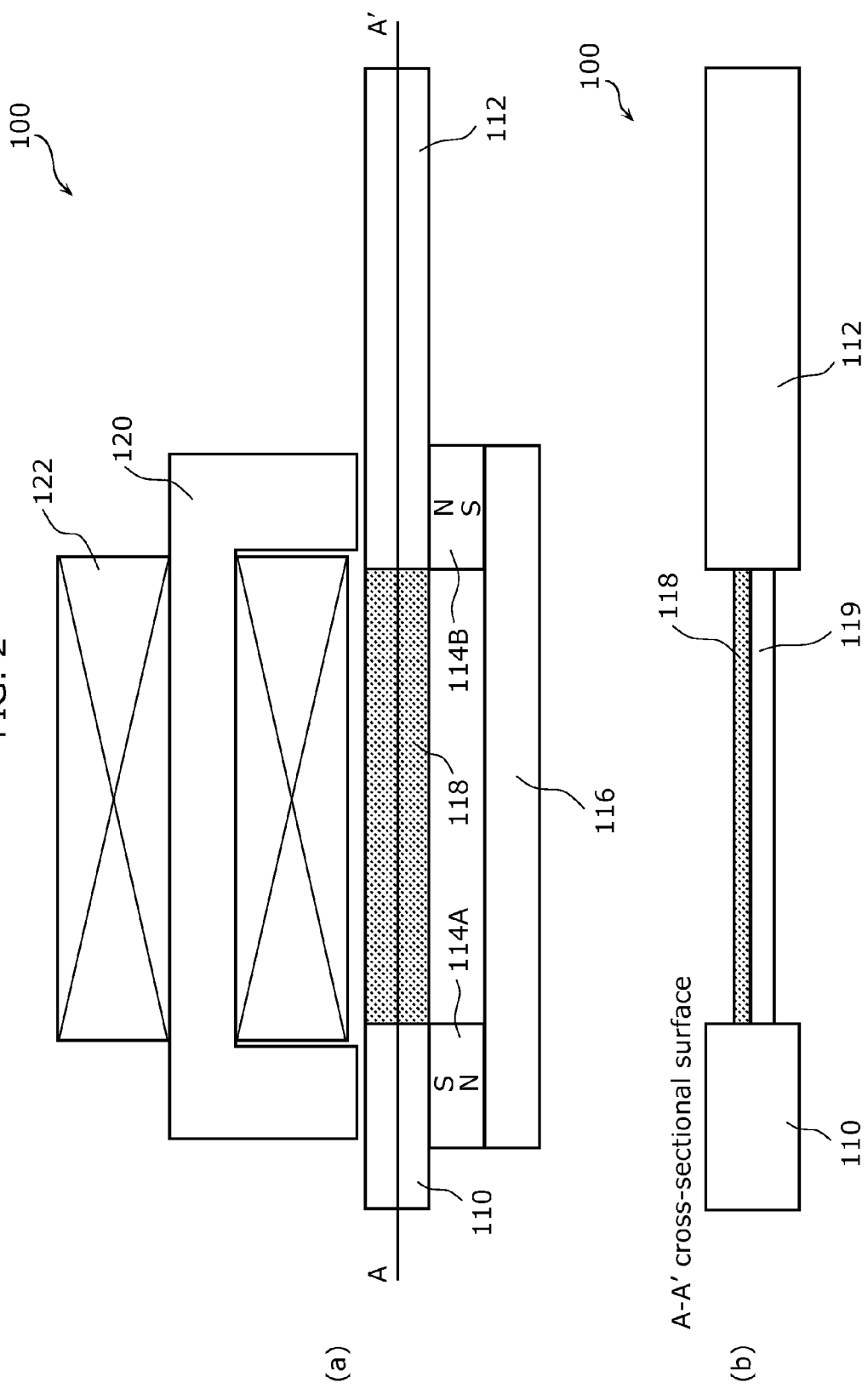

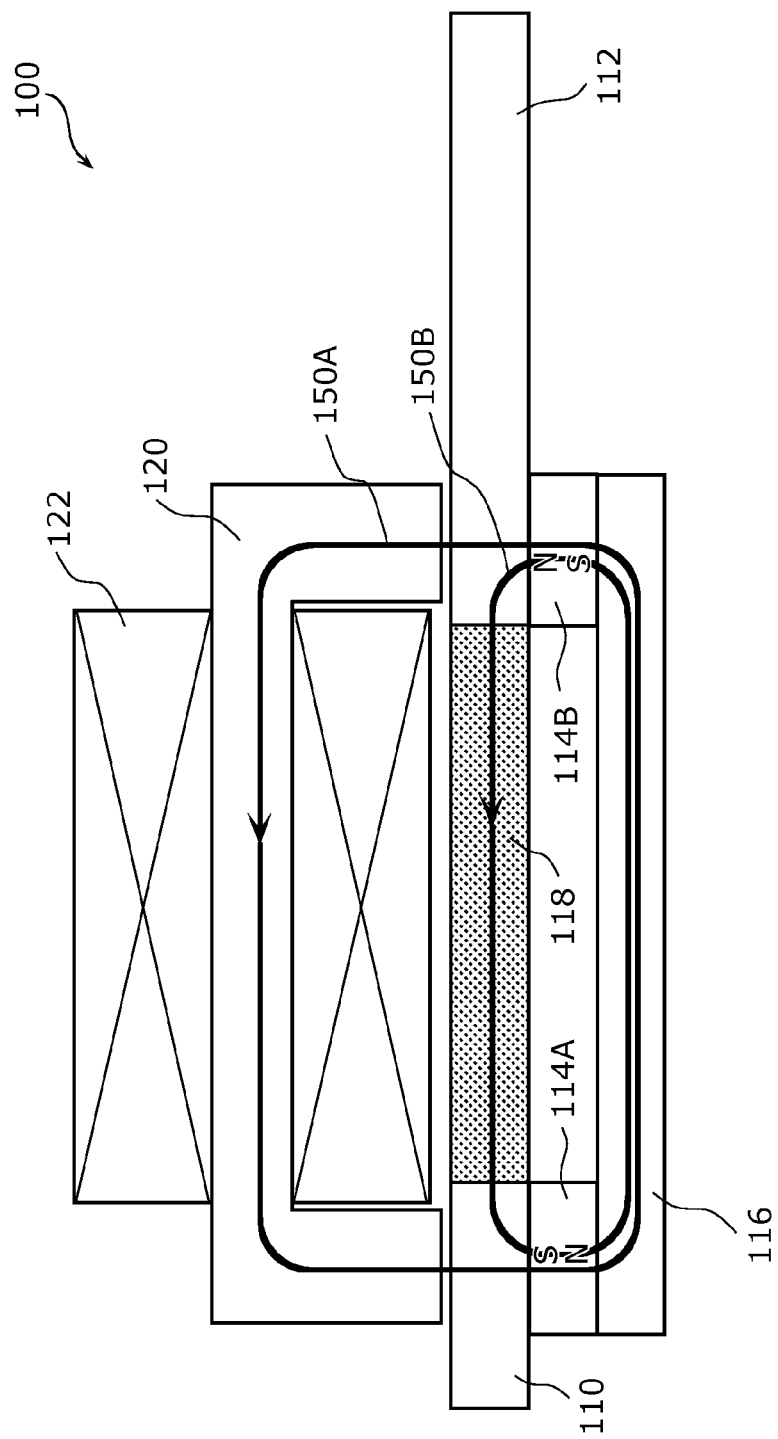

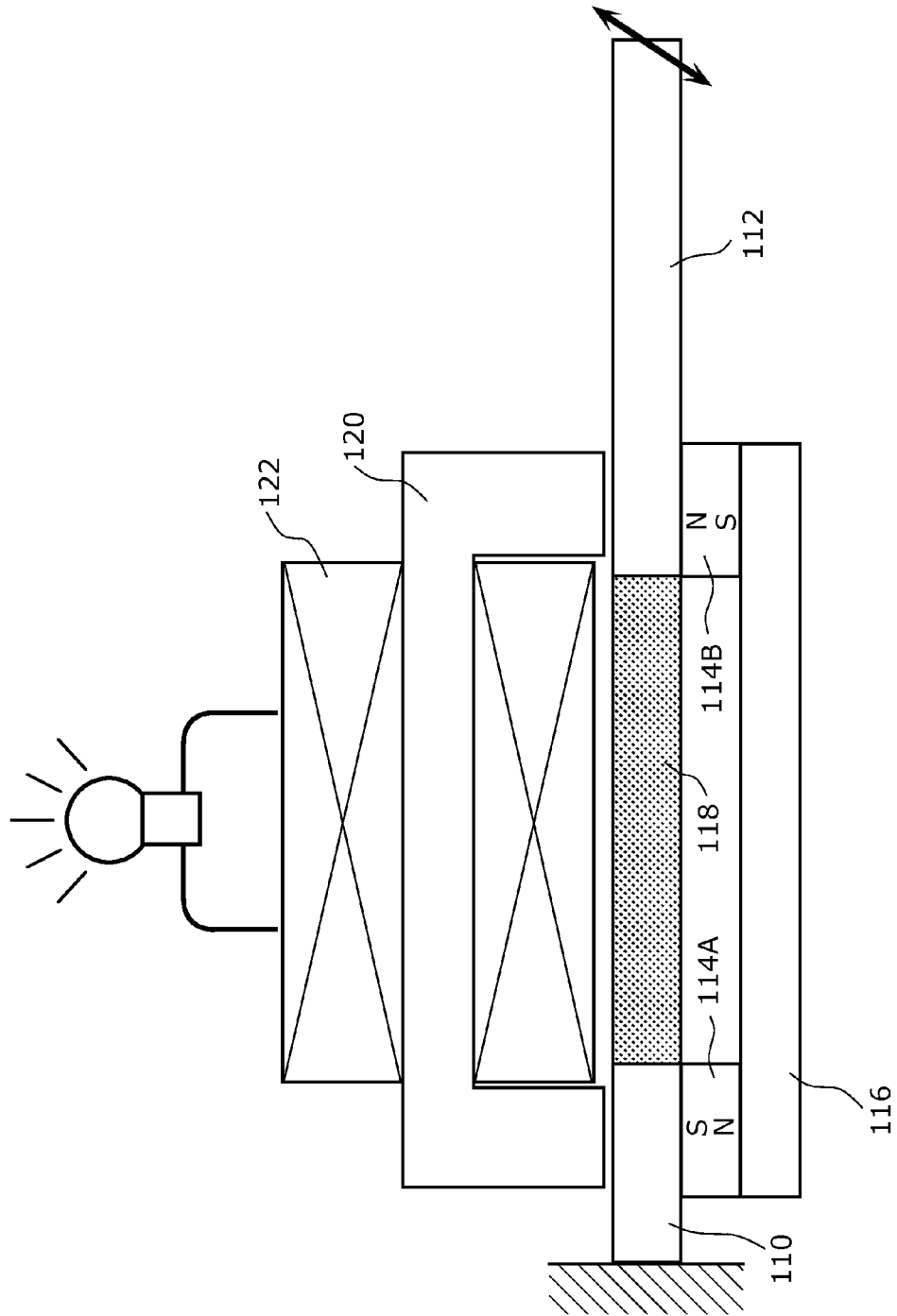

Extension and contraction

POWER GENERATING ELEMENT AND POWER GENERATION DEVICE

TECHNICAL FIELD

The present invention relates to power generating elements using vibration and, in particular, to a power generating element or the like which includes a magnetostrictive material.

BACKGROUND ART

Conventionally, techniques for generating power from ambient vibration have been actively developed. Among them, a technique for generating power from piezoelectric elements and a technique for generating power from a change in a magnetic flux density of a permanent magnet are known.

Many of the methods for generating power using piezoelectric elements are performed by generating power by deforming the piezoelectric elements by external force in some way or other. Methods for deforming piezoelectric elements include a method for deforming piezoelectric elements by application of vibration to piezoelectric elements, a method for indirectly applying pressure such as wind pressure or sound pressure, a method for causing an object such as a weight to collide with piezoelectric elements, and a method for attaching piezoelectric elements to a deformed object (for example, refer to Patent Literature 1). Patent Literature 1 discloses a sound power generation apparatus which generates power by a piezoelectric element using air pressure fluctuation caused by sound and a vibration power generation apparatus which generates power by piezoelectric elements using pressure fluctuation caused by vibration.

Moreover, a method for generating power using a change in magnetic flux of a permanent magnet is a method for generating power by a temporal change in interlinkage magnetic flux density of coil caused by vibration of the permanent magnet, that is, a method for generating power using electromagnetic induction (for example, refer to Non Patent Literature 1 and Patent Literature 2).

In Non Patent Literature, a permanent magnet is vibrated within the coil in parallel with a magnetization direction. As a result, a magnetic flux density within the coil is changed which causes a current to flow through the coil. Non Patent Literature 1 discloses a power generating element that generates power using the above phenomenon.

Patent Literature 2 discloses a power generating element including: a bias magnet which is magnetized in two poles; a magnetostrictive material which changes magnetic permeability through an inverse magnetostrictive effect by applying force from outside and changes a flow of magnetic flux; a compressing means which periodically compresses the magnetostrictive material in a direction having magnetic anisotropy; and a coil means which induces current by the periodically changing magnetic flux. In the power generating element, the magnetostrictive material, the coil, and the compressing means are disposed such that the periodically changing magnetic flux and the coil wound around the coil center form a linkage. In other words, this is a structure which generates power with current which is generated in the coil by periodically compressing, in a longitudinal direction, the magnetostrictive material having magnetic anisotropy in a longitudinal direction.

The piezoelectric element disclosed in Patent Literature 1 has large piezoelectric longitudinal constant and high power generation efficiency of piezoelectric vertical effect (when the direction of force and the direction of taking out voltage are the same). However, when power is generated using bending deformation through deforming a single-plate piezoelectric material, voltage is taken out in a direction perpendicular to a direction of force (piezoelectric horizontal effect), with the result that the power generation efficiency is low. Moreover, the piezoelectric material is a brittle material which is easily damaged by bending and impact. Therefore, there is a problem that an excessive load cannot be applied to the piezoelectric material and it is difficult to apply large bending to and have a large impact on the material for increasing power generation capacity. Moreover, the piezoelectric element has high impedance in low frequency since it is electrically inductive load. Furthermore, when a load having lower impedance than the piezoelectric element is connected to the piezoelectric element, voltage generated at the load is low. As a result, there is a demerit that power obtained from power generation is low and power generation efficiency is low.

Moreover, in the method for generating power using a change in linkage magnetic flux density in the coil caused by the vibration of the permanent magnet as disclosed in Non Patent Literature 1, it is necessary to cause a vibrator to vibrate at large amplitude and high frequency for increasing power generation capacity. When the size of the permanent magnet used as the vibrator is large, the mass of the vibrator is high while the resonance frequency of the vibrator is low. As a result, there is a problem that the power generation capacity is not increased.

Moreover, the method for generating power by periodically compressing the magnetostrictive material disclosed in Patent Literature 2 requires large force for compressing the magnetostrictive material in a longitudinal direction. Moreover, there is a problem that since the compression force is unevenly applied to the magnetostrictive material, power generation efficiency is low.

CITATION LIST

Patent Literatures

[Patent Literature 1] Japanese Unexamined Patent Application Publication No. 2006-166694
[Patent Literature 2] Japanese Unexamined Patent Application Publication No, 2008-72862

Non Patent Literature

Hiroshi Hosaka, "Wearable john kiki no tame no shindo hassei gijutsu" (Vibration Power-Generation Technologies for Wearable Information Devices), Journal of the Institute of Electrical Engineers of Japan, vol. 126, no. 4, 2006

DISCLOSURE OF INVENTION

Problems that Invention is to Solve

In order to solve the above problems, it is considered that power is generated by vibrating a magnetostrictive material. In more detail, as a related art of the present invention, for example, there is conceived a power generating element characterized by including: two magnetostrictive rods disposed in parallel with each other and made of a magnetostrictive material; coils each wound around a corresponding one of the two magnetostrictive rods; and two connecting yokes each provided at a corresponding one of the ends of the two magnetostrictive rods to connect the two magnetostrictive rods, wherein the power generating element generates power through extension of one of the two magnetostrictive rods and contraction of the other of the two magnetostrictive rods due to vibration in a direction perpendicular to an axis direction of the two magnetostrictive rods.

With the above structure, the extension and contraction of the two magnetostrictive rods made of a magnetostrictive material can generate power due to a temporal change of a magnetic flux density using an inverse magnetostrictive effect. Since the power generating element includes a combination of the two magnetostrictive rods, when the power generating element is applied with vibration in a direction perpendicular to an axis direction of the two magnetostrictive rods, one of the two magnetostrictive rods is extended and the other is contracted. As a result, it is possible to generate power with a small force and a high efficiency. Moreover, since the magnetostrictive rods are made of a magnetostrictive material having resistance to an external force such as bending and impact, it is possible to apply large bending to and have a large impact on the power generating element for increasing a power generation amount.

However, the above-described structure using a magnetostrictive material restricts the number of turns in a coil which contributes to a generated voltage, which causes a problem of restricting a magnitude of the generated voltage.

The following provides detailed explanation.

In general, a voltage generated by a vibration power generating element using electromagnetic induction is proportional to (a) a temporal change of magnetic flux and (b) the number of turns in a coil. Here, a upper limit of the temporal change of magnetic flux depends on mechanical features (mainly, resonant frequency) of the power generating element. Therefore, in order to increase a generated voltage of the power generating element, it is preferable to increase the number of turns in a coil.

However, in the structure according to the related art of the present invention, the two magnetostrictive rods form a parallel-beam structure. Moreover, a coil is wound around each of the magnetostrictive rods. Therefore, the coils can be wound only in a gap between the parallel beams that are the two magnetostrictive rods. Therefore, an upper limit of the number of turns in the coil is restricted. As a result, a magnitude of a generated voltage is restricted.

In order to address the above problems, an object of the present invention is to provide a power generating element not restricting the number of turns in a coil which contributes to a generated voltage.

Means to Solve the Problems

In accordance with an aspect of the present invention, there is provided a power generating element including: a magnetostrictive plate including a magnetostrictive material; a yoke around which a coil is wound, the yoke having a substantial U shape with two ends magnetically connected to a surface of the magnetostrictive plate; and a magnetic field part which generates bias magnetic flux circulating through the yoke from one of the two ends of the yoke to an other one of the two ends of the yoke, wherein the magnetostrictive plate is surface-bonded to a non-magnetic structural body.

With the above structure, in the power generating element, vibration of the non-magnetic structural body causes a temporal change of a magnetic flux in the yoke. Here, a height of the yoke from the plane including the magnetostrictive plate (a height of legs of the yoke) can be flexibly determined. Therefore, it is possible to wind a coil around the yoke with turns required to generate a desired voltage. As a result, it is possible to provide the power generating element that does not restrict the number of turns in the coil which contributes to a generated voltage. Furthermore, since the magnetostrictive plate is surface-bonded to the non-magnetic structural body, it is possible to efficiently use vibration of the non-magnetic structural body to generate power. Moreover, if the magnetostrictive element is arranged on the structural body, and a magnetic circuit including a magnet and a yoke around which a coil wound is disposed on the structural body, it is possible to provide a power generating element. As a result, it is possible to generate power by simply providing the power generating element to a desired structural body.

It is also possible that the yoke includes a first yoke, a second yoke, and a third yoke, the first yoke being in parallel to the magnetostrictive plate, the second yoke having a portion connected to one end portion of the first yoke and an other portion connected to one end portion of the magnetostrictive plate, and the third yoke having a portion connected to an other end portion of the first yoke and an other portion connected to an other end portion of the magnetostrictive plate, and the magnetic field part includes a first permanent magnet and a second permanent magnet so as to generate magnetic flux passing through the first yoke, the second yoke, the third yoke, and the magnetostrictive plate, the first permanent magnet being close to the second yoke and connected to one end portion of the first yoke and one end portion of the magnetostrictive plate, and the second permanent magnet being close to the third yoke and connected to an other end portion of the first yoke and an other end portion of the magnetostrictive plate.

With the structure, the power generating element forms a magnetic field line loop passing through the magnetostrictive plate, the second yoke, the third yoke, and the first yoke. When the structural body extends and contracts, the magnetostrictive plate on the structural body also extends and contracts, thereby changing magnetization in the magnetostrictive plate due to the inverse magnetostriction effect. The magnetization change (temporal change of magnetic field lines) is taken out as an electromotive force of the coil, thereby increasing a power generation amount.

It is further possible that the non-magnetic structural body includes a pair of parallel beams arranged in parallel to each other, and the magnetostrictive plate is surface-bonded to a root of a corresponding one of the parallel beams.

With the above structure, the vibrated beam vibrates at a high resonant frequency. Furthermore, since the facing two beams forming parallel beams exert tuning-fork vibration, the beams keep vibrating for a long time. Therefore, the power generator can generate a high voltage and keep the power generation for a long time.

In accordance with another aspect of the present invention, there is provided a power generating element including: a magnetostrictive rod including a magnetostrictive material; a rigid rod in parallel to the magnetostrictive rod, the rigid rod having a stiffness and a shape for applying a homogeneous compression or tension force to the magnetostrictive rod; two connecting yokes each provided at a corresponding one of both ends of each of the magnetostrictive rod and the rigid rod so as to physically connect the magnetostrictive rod and the rigid rod to each other; a first yoke magnetically connecting the two connecting yokes together, the first yoke being wound with a coil; and a magnetic field part which generates bias magnetic flux circulating through the first yoke from one of the two connecting yokes to an other of the two connecting yokes, wherein the magnetostrictive rod extends or contracts in an axis direction of the magnetostrictive rod, thereby generating power.

With the above structure, in the power generating element, vibration of the movable yoke causes a temporal change of a magnetic flux in the yoke. Here, a height of the yoke from the plane including the magnetostrictive rod and the rigid rod (a length of legs of the yoke) can be flexibly determined. Therefore, it is possible to wind a coil around the yoke with turns required to generate a desired voltage. As a result, it is possible to provide the power generating element that does not restrict the number of turns in the coil which contributes to a generated voltage.

It is also possible that the magnetic field part includes a first permanent magnet, a second permanent magnet, and a second yoke, the first permanent magnet sticking to one of the two connecting yokes by a magnetic force, the second permanent magnet sticking to an other one of the two connecting yokes by a magnetic force, and the second yoke magnetically connecting the first permanent magnet and the second permanent magnet to each other, and the second yoke is stuck to the first permanent magnet and the second permanent magnet by a magnetic force produced by the first permanent magnet and a magnetic force produced by the second permanent magnet.

With the above structure, the magnetic field part can be implemented by using permanent magnets.

It is further possible that the first yoke is stuck to the two connecting yokes by the magnetic force produced by the first permanent magnet and the magnetic force produced by the second permanent magnet.

With the above structure, it is not necessary to wind a coil around the magnetostrictive rod that vibrates. Therefore, wires of a coil are not chafed due to bending deformation of the magnetostrictive rod. As a result, a risk of breakdown due to wire breaking or the like is reduced. In addition, the wires of the coil do not disrupt the movement of the magnetostrictive rod, so that a force applied to the movable yoke can be more efficiently used for power generation.

It is still further possible that the first yoke is wound with a first coil that is the coil, the magnetic field part is a second coil that is wound around the magnetostrictive rod, and a current flows through the second coil wound around the magnetostrictive rod to generate bias magnetic flux in the magnetic field part, and the power generating element takes out a current flowing through the first coil wound around the first yoke to generate power, the current being caused when the magnetostrictive rod is extended or contracted in the axis direction of the magnetostrictive rod.

It is still further possible that the magnetostrictive rod is wound with a first coil, the magnetic field part includes the first yoke and a second coil wound around the first yoke, and a current flows through the second coil to generate bias magnetic flux in the magnetic field part, and the power generating element takes out a current flowing through the first coil wound around the magnetostrictive rod to generate power, the current being caused when the magnetostrictive rod is extended or contracted in the axis direction of the magnetostrictive rod.

The structure of generating bias magnetic flux without using a permanent magnet is advantageous in, particularly, increasing a size of the power generating element. This is because it is difficult to manufacture a permanent magnet made of rare earth enabling generation of bias magnetic flux having a strength required for a large power generating element, and to provide such a permanent magnet to the power generating element.

It is still further possible that the magnetostrictive rod is surface-bonded to the rigid rod.

This structure can increase a strength of the magnetostrictive rod and the rigid rod. Furthermore, an elasticity loss in vibration can be suppressed.

It is still further possible that the magnetostrictive rod is not wound with a coil, and the power generating element takes out a current flowing through the coil wound around the first yoke to generate power, the current being caused when the magnetostrictive rod is extended or contracted in the axis direction of the magnetostrictive rod.

It should be noted that the present invention can be implemented not into the above-described power generating element, but also into a power generation device including the above-described power generating element.

Effects of the Invention

Thus, the present invention can provide a power generating element not restricting the number of turns in a coil which contributes to a generated voltage.

BRIEF DESCRIPTION OF DRAWINGS

FIG. 1A is a view of a structure of a power generating element according to a related art of the present invention.

FIG. 2 illustrates views of a structure of a power generating element according to Embodiment 1 of the present invention.

FIG. 3 is a conceptual view of magnetic flux caused by a magnetic field part in the power generating element.

FIG. 5B is a view illustrating the situation where power is taken out from a coil wound around the yoke by applying the vibration as illustrated in FIG. 5A.

BEST MODE FOR CARRYING OUT THE INVENTION

The following describes embodiments according to the present invention in detail with reference to the drawings. It should be noted that all the embodiments described below are specific examples of the present invention. Numerical values, shapes, materials, constituent elements, arrangement positions and the connection configuration of the constituent elements, steps, the order of the steps, and the like described in the following embodiments are merely examples. They are therefore not intended to limit the present invention. The present invention is based on the appended claims only. Therefore, among the constituent elements in the following embodiments, constituent elements that are not described in independent claims that show the most generic concept of the present invention are described as elements constituting more desirable configurations, although such constituent elements are not necessarily required to achieve the object of the present invention.

First, in order to clarify the problem to be solved by the present invention, related arts of the present invention are described with reference to FIGS. 1A and 1B.

Figure 1B:
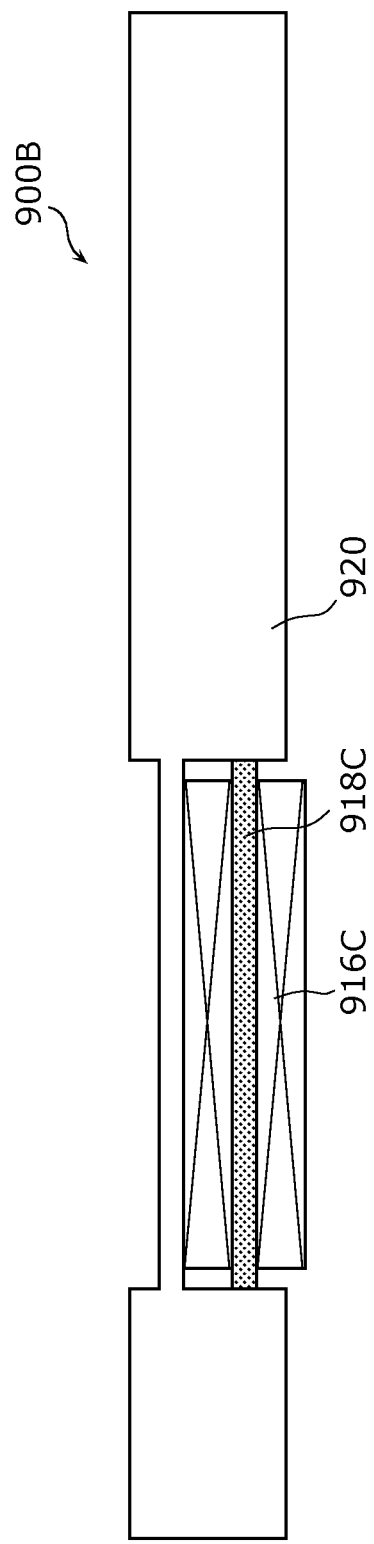
FIG. 1B is a view of a structure of a power generating element including, instead of a magnetostrictive material, a beam integrated with yokes.

FIG. 1A illustrates a structure of a power generating element 900A according to a related art of the present invention. FIG. 1B illustrates a structure of a power generating element 900B according to another related art of the present invention.

As illustrated in FIG. 1A, the power generating element 900A includes a fixed yoke 912, a movable yoke 914, coils 916A and 916B, and magnetostrictive rods 918A and 918B which are made of a magnetostrictive material.

The magnetostrictive rods 918A and 918B form a parallel-beam structure. Ends of the magnetostrictive rods 918A and 918B are physically connected to each other by the fixed yoke 912. The other ends of the magnetostrictive rod 918A and the rigid rod 918B are physically connected to the movable yoke 914.

Around the magnetostrictive rod 918A, the coil 916A is wound. Around the magnetostrictive rod 918B, the coil 916B is wound.

Here, in a magnetic field, when the movable yoke 914 is vibrated to extend one of the magnetostrictive rods 918A and 918B and contract the other, an inverse magnetostrictive effect is produced in the magnetostrictive rods 918A and 918B. As a result, magnetic flux around each of the coils 916A and 916B is changed. Therefore, an electromotive force occurs in each of the coils 916A and 916B. In the above manner, the power generating element 900A can generate power by vibration.

FIG. 1B illustrates a structure of the power generating element 900B that includes parallel beams one of which is not the magnetostrictive rod 918B but a beam integrated with a yoke 920.

Also in the power generating element 900B, in a magnetic field, when the yoke 920 is vibrated, an inverse magnetostriction effect is produced in a magnetostrictive rod 918C. As a result, magnetic flux around a coil 916C is changed. Therefore, an electromotive force occurs in the coil 916C. In the above manner, the power generating element 900B can generate power by vibration.

Here, a voltage generated by the power generating element 900A or 900B is determined according to the following Equation (1).

[Math. 1]

$$V = N\frac{d\Phi}{dt} \quad \text{Equation (1)}$$

where N represents the number of turns in a coil, and Φ represents magnetic flux. Therefore, it is possible to increase a generated voltage by increasing the change amount of magnetic flux per hour or by increasing the number of turns in a coil. The change amount of magnetic flux per hour depends on mechanical features such as a resonant frequency of the power generating element. Therefore, the increase of the number of turns in a coil is easier to increase a generated voltage of the power generating element.

However, with reference to, for example, FIG. 1A, in the related art, it is necessary to wind the coils 916A and 916B around the magnetostrictive rods 918A and 918B, respectively, in which an inverse magnetostriction effect is produced. Furthermore, the magnetostrictive rods 918A and 918B have a parallel-beam structure. As a result, a space allowing the turns of the coils 916A and 916B is restricted to a gap between the parallel beams. There is therefore a problem that an upper limit of a voltage determined according to the Equation (1) is restricted by the gap between the parallel beams.

The present invention solves the above problem. The following describes embodiments of the present invention.

Embodiment 1

FIG. 2 illustrates a structure of a power generating element 100 according to Embodiment 1 of the present invention.

(a) in FIG. 2 is an external plan view of the power generating element 100. (b) in FIG. 2 is a cross-sectional view of the power generating element 100 taken along line A-A' of (a) in FIG. 2.

As seen in (a) and (b) of FIG. 2, the power generating element 100 includes a fixed yoke 110, a movable yoke 112, permanent magnets 114A and 114B, a yoke 116, a magnetostrictive rod 118 including a magnetostrictive material, a rigid rod 119 including a non-magnetic material, a yoke 120, and a coil 122. Hereinafter, the yoke 120 is referred to also as a first yoke, and the yoke 116 is referred to also as a second yoke. Furthermore, the fixed yoke 110 and the movable yoke 112 are referred to also as connecting yokes.

Preferably, the magnetostrictive rod 118 is a rod-shaped member including a magnetostrictive material having a ductibility, such as iron gallium alloy or iron cobalt alloy. Regarding a size of the magnetostrictive rod 118, for example, the magnetostrictive rod 118 may be a prismatic rod in shape having a cross-sectional surface of approximately 1 mm×0.5 mm, a length in an axis direction of approximately 10 mm.

The rigid rod 119 has a stiffness and a shape to apply a homogeneous compression or tension force to the magnetostrictive rod 118. The rigid rod 119 is arranged in parallel to the magnetostrictive rod 118. A material of the rigid rod 119 may be, for example, stainless steal (SUS304 or the like). The rigid rod 119 has the same size as the size of the magnetostrictive rod 118.

In the present embodiment, the magnetostrictive rod 118 and the rigid rod 119 are surface-bonded to each other as seen in (b) in FIG. 2. In other words, an entire surface of the magnetostrictive rod 118 is bonded to an entire surface of the rigid rod 119 facing the magnetostrictive rod 118. However, as described later, the magnetostrictive rod 118 and the rigid rod 119 are not necessarily surface-bonded to each other. Any arrangement is possible as long as the magnetostrictive rod 118 and the rigid rod 119 are arranged in parallel to each other.

The fixed yoke 110 is a yoke physically and magnetically connecting ends of the magnetostrictive rod 118 and the rigid rod 119 to each other. The movable yoke 112 is a yoke physically and magnetically connecting the other ends of the magnetostrictive rod 118 and the rigid rod 119 to each other. The fixed yoke 110 is fixed. The movable yoke 112 vibrates in a direction perpendicular to the sheet of (a) in FIG. 2 (in a direction from front to back or from back to front on the sheet in (a) in FIG. 2).

The yoke 120 magnetically connecting the two connecting yokes (namely, the fixed yoke 110 and the movable yoke 112) to each other. Around the yoke 120, the coil 122 is wound.

The permanent magnet 114A (referred to also as a first permanent magnet) sticks to the fixed yoke 110 by a magnetic force. The permanent magnet 114B (referred to also as a second permanent magnet) sticks to the movable yoke 112 by a magnetic force.

The yoke 116 magnetically connects the permanent magnets 114A and 114B to each other.

Here, the yoke 116 is stuck by the permanent magnets 114A and 114B by a magnetic force produced by the permanent magnets 114A and 114B. Furthermore, the yoke 120 is stuck by the two connecting yokes by a magnetic force produced by the permanent magnets 114A and 114B.

In the present embodiment, a set of the yoke 120 and the coil 122 is referred to as a power generation part. Furthermore, a set of the fixed yoke 110, the movable yoke 112, the magnetostrictive rod 118, and the rigid rod 119 is referred to as a vibration part. Moreover, a set of the permanent magnets 114A and 114B and the yoke 116 is referred to as a magnetic field part. Here, each of the power generation part and the magnetic field part is stuck by the vibration part by a magnetic force. In other words, each of the power generation part and the magnetic field part is not physically connected to the vibration part. Therefore, when the vibration part vibrates in a horizontal direction in (a) in FIG. 2, the power generation part and the magnetic field part do not produce a force constraining bending deformation of the vibration part except a friction force. Therefore, the power generating element 100 can use a force for vibrating the movable yoke 112 to generate power without wasting it.

Next, the mechanism of the vibration power generation by the above-described power generating element 100 is described with reference to FIGS. 3, 4A, and 4B.

FIG. 3 is a conceptual diagram illustrating magnetic flux caused by the magnetic field part in the power generating element.

As seen in FIG. 3, the magnetic field part (114A, 114B, and 116) generates bias magnetic flux that circulates from one of the two connecting yokes to the other along a path penetrating the magnetostrictive rod 118 and along a path penetrating the yoke 120. More specifically, the magnetic field part generates (a) bias magnetic flux 150A that circulates, penetrating the permanent magnet 114A, the yoke 116, the permanent magnet 114B, and the yoke 120, and (b) bias magnetic flux 150B that circulates, penetrating the permanent magnet 114A, the yoke 116, the permanent magnet 114B, and the magnetostrictive rod 118.

It is preferable that the shapes of the permanent magnets 114A and 114B, the shape (cross-sectional area or the like) of the yoke 120, and a magnetic permeability of the yoke are adjusted to produce bias magnetic flux having a magnetic flux density that is approximately a half of a saturation magnetic flux density of the magnetostrictive material.

Figure 4A:
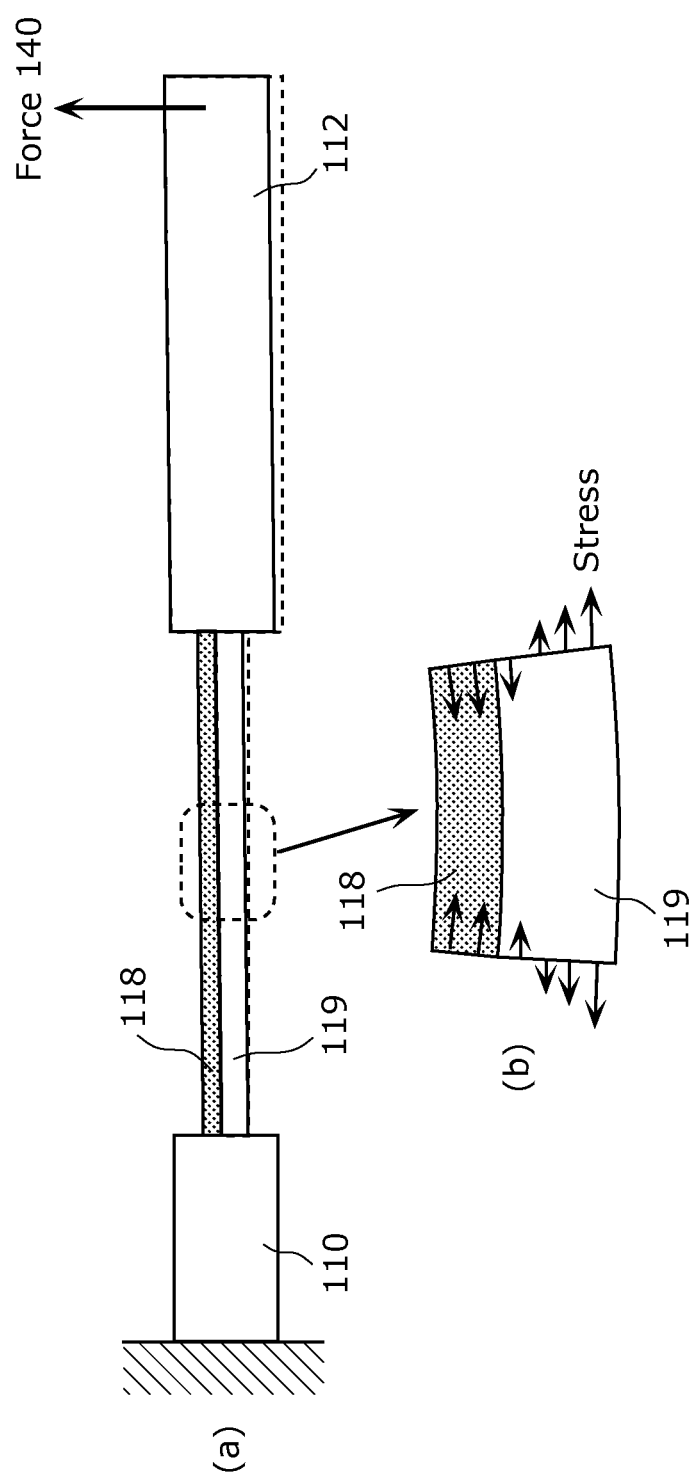
FIG. 4A is a view illustrating stress distribution around the center of a magnetostrictive rod and a rigid rod when a movable yoke included in the power generating element is applied with a force.

(a) in FIG. 4A illustrates the situation where the movable yoke 112 included in the power generating element 100 with the bias magnetic flux seen in FIG. 3 is applied with a force 140. (b) in FIG. 4A illustrates stress distribution around the center of the magnetostrictive rod 118 and the rigid rod 119 when the force illustrated in (a) in FIG. 4A is applied.

As seen in (a) in FIG. 4A, for example, it is assumed that the fixed yoke 110 is fixed by supporting one end of the fixed yoke 110 and an upward bending force 140 is applied to the movable yoke 112. In the situation, the magnetostrictive rod 118 and the rigid rod 119 are bent. If a longitudinal elasticity modulus and a thickness of the rigid rod 119 are set to be greater than those of the magnetostrictive material, an almost homogeneous stress (here, a compression force) is applied to the magnetostrictive rod 118 in a compressing direction as illustrated in (b) in FIG. 4A. As a result, the inverse magnetostriction effect produced in the magnetostrictive rod 118 reduces the magnetic flux. The magnetic flux distribution in the above situation is described with reference to FIG. 4B.

Figure 4B:
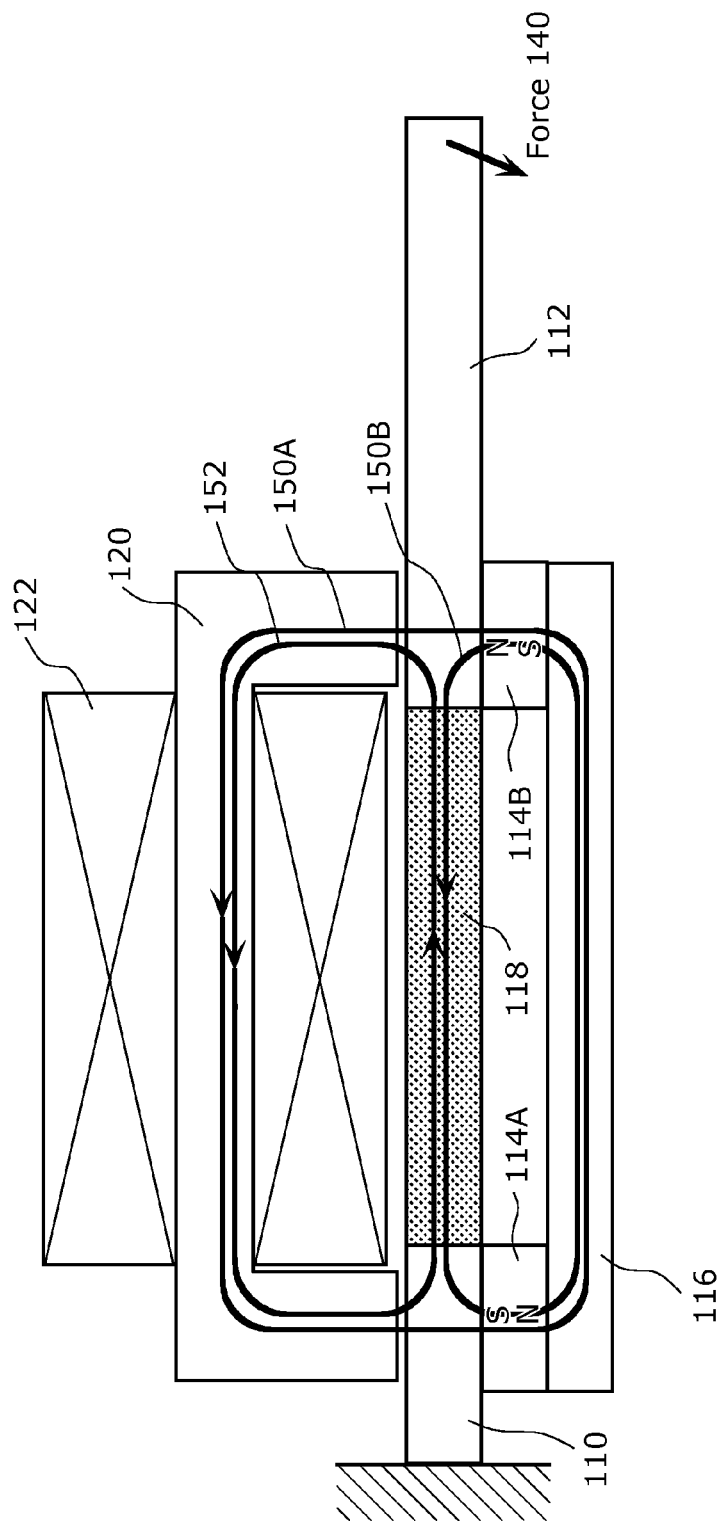
FIG. 4B is a schematic view of magnetic flux caused inside the magnetostrictive rod when the force illustrated in FIG. 4A is applied.

FIG. 4B is a schematic view of magnetic flux caused inside the magnetostrictive rod 118 when the force 140 illustrated in FIG. 4A is applied The inverse magnetostriction effect produces magnetic flux 152 that circulates sequentially from the magnetostrictive rod 118, the movable yoke 112, the yoke 120, and the fixed yoke 110, and then back to the magnetostrictive rod 118. The magnetic flux 152 overlaps the bias magnetic flux 150A and the bias magnetic flux 150B. It should be noted that the permanent magnets have a large magneto resistance so that the magnetic flux produced by the inverse magnetostriction effect hardly passes through the permanent magnets 114A and 114B. Furthermore, although, in FIG. 4B, loops of magnetic field lines (magnetic flux) caused in the power generating element 100 illustrate the bias magnetic flux 150A, the bias magnetic flux 150B, and the magnetic flux 152, but the loops are mere examples and any other combination of loops can be possible. The loops of magnetic field lines (magnetic field line loops) depend on a structure of magnetic circuits implemented by the power generating element. For example, when magnetic circuits implemented by the power generating element are arranged in parallel, a plurality of magnetic field line loops occur in parallel. On the other hand, when magnetic circuits are arranged in series, a single magnetic field line loop occurs as described later.

As a result, a change of magnetic flux produced by bending the magnetostrictive rod 118 and the rigid rod 119 by the force 140 causes a change of magnetic flux in the yoke 120.

Therefore, when a vibration force periodically inverts a direction of a bending force applied to the yoke 120, the magnetic flux of the magnetostrictive rod 118 is temporally changed. As a result, the magnetic flux generated in the yoke 120 is also temporally changed.

The power generating element 100 according to the present embodiment uses, as power, an electromotive force caused in a coil wound around the yoke 120 by a temporal change of magnetic flux caused in the yoke 120 according to Faraday's law of electromagnetic induction.

Figure 5A:
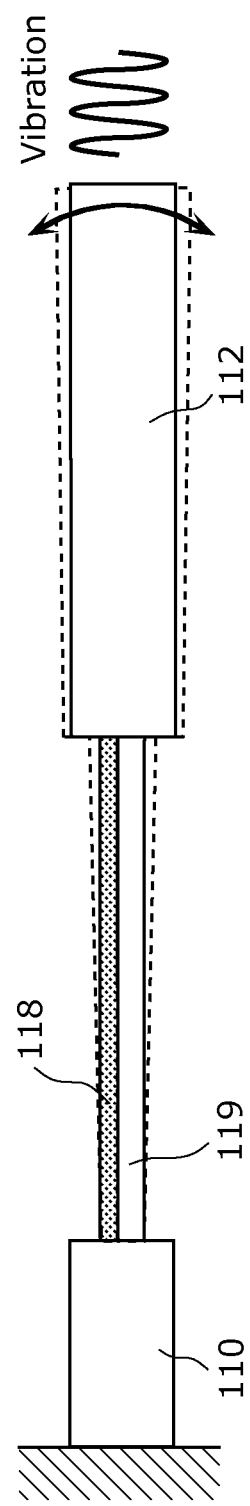
FIG. 5A is a view illustrating the situation where a movable yoke included in the power generating element according to each of Embodiments 1 and 2 of the present invention is vibrated.

FIG. 5A illustrates the situation where the movable yoke 112 included in the power generating element 100 according to the present embodiment is vibrated. FIG. 5B illustrates the situation where power is taken out from the coil 122 wound around the yoke 120 by applying the vibration as illustrated in FIG. 5A.

As described above, the power generating element 100 according to the present embodiment includes: the magnetostrictive rod 118 including a magnetostrictive material; the rigid rod 119 in parallel to the magnetostrictive rod 118, having a stiffness and a shape for applying a homogeneous compression or tension force to the magnetostrictive rod 118; the two connecting yokes (namely, the fixed yoke 110 and the movable yoke 112) each provided at a corresponding one of both ends of each of the magnetostrictive rod 118 and the rigid rod 119 so as to physically connect the magnetostrictive rod 118 and the rigid rod 119 to each other; the first yoke 120 around which the coil 122 is wound and which magnetically connects the two connecting yokes together; the first yoke around which the coil 122 is wound and which magnetically connecting the two connecting yokes together; the magnetic field part which generates bias magnetic flux circulating through the first yoke 120 from one of the two connecting yokes to the other one of the two connecting yokes. Here, when the magnetostrictive rod 118 is extended or contracted in an axis direction of the magnetostrictive rod 118 (in other words, in a plane including both the magnetostrictive rod 118 and the rigid rod 119), the power generating element 100 generates power.

More specifically, the magnetic field part includes: the first permanent magnet 114A and the second permanent magnet 114B, and the second yoke 116. The first permanent magnet 114A sticks to one of the two connecting yokes by a magnetic force. The second permanent magnet 114B sticks to the other one of the two connecting yokes by a magnetic force. And, the second yoke 116 magnetically connects the first permanent magnet 114A and the second permanent magnet 114B to each other. Here, the second yoke 116 is stuck to the first permanent magnet 114A and the second permanent magnet 114B by a magnetic force produced by the first permanent magnet 114A and a magnetic force produced by the second permanent magnet 114B. Furthermore, the first yoke 120 is stuck to the two connecting yokes (namely, the fixed yoke 110 and the movable yoke 112) by the magnetic force produced by the first permanent magnet 114A and the magnetic force produced by the second permanent magnet 114B.

With the above structure, in the power generating element 100, vibration of the movable yoke 112 causes a temporal change of the magnetic flux in the yoke 120. Here, referring back to (a) in FIG. 2, a height of the yoke 120 from the plane including the magnetostrictive rod 118 and the rigid rod 119 (namely, a length of legs in a U shape) can be flexibly determined. Therefore, it is possible to wind a coil around the yoke 120 with turns required to generate a desired voltage. As a result, it is possible to provide the power generating element 100 that does not restrict the number of turns in the coil 122 which contributes to a generated voltage.

Furthermore, in the power generating element 100 according to the present embodiment, it is not necessary to wind a coil around the magnetostrictive rod 118 that vibrates. Therefore, wires of a coil are not chafed due to bending deformation of the magnetostrictive rod 118. As a result, a risk of breakdown due to wire breaking or the like is reduced. In addition, the wires of the coil do not disrupt the movement of the magnetostrictive rod 118, so that a force applied to the movable yoke 112 can be more efficiently used for power generation. Furthermore, in comparison to the structure in which a coil is wound around the magnetostrictive rod 118, treatment for ends of a coil is easier.

Moreover, in the related arts of the present invention, since there is a gap between the magnetostrictive rod 118 and the rigid rod 119 forming parallel beams in the vibration part, a stress is likely to be concentrated on portions where the magnetostrictive rod 118 and the rigid rod 119 are connected to the connecting yoke, so that there is a high risk of damaging the part. In the present embodiment, however, the magnetostrictive rod 118 and the rigid rod 119 are surface-bonded to each other to form a multiple-beam structure having a single plate shape. This structure can increase a strength of the magnetostrictive rod 118 and the rigid rod 119. Furthermore, this structure can suppress an elasticity loss in vibration to be low. It should be noted that the magnetostrictive rod 118 and the rigid rod 119 are not necessarily surface-bonded to each other. In other words, the same effects as described above can be produced even if the parallel beams have a gap between them.

Embodiment 2

Figure 6:
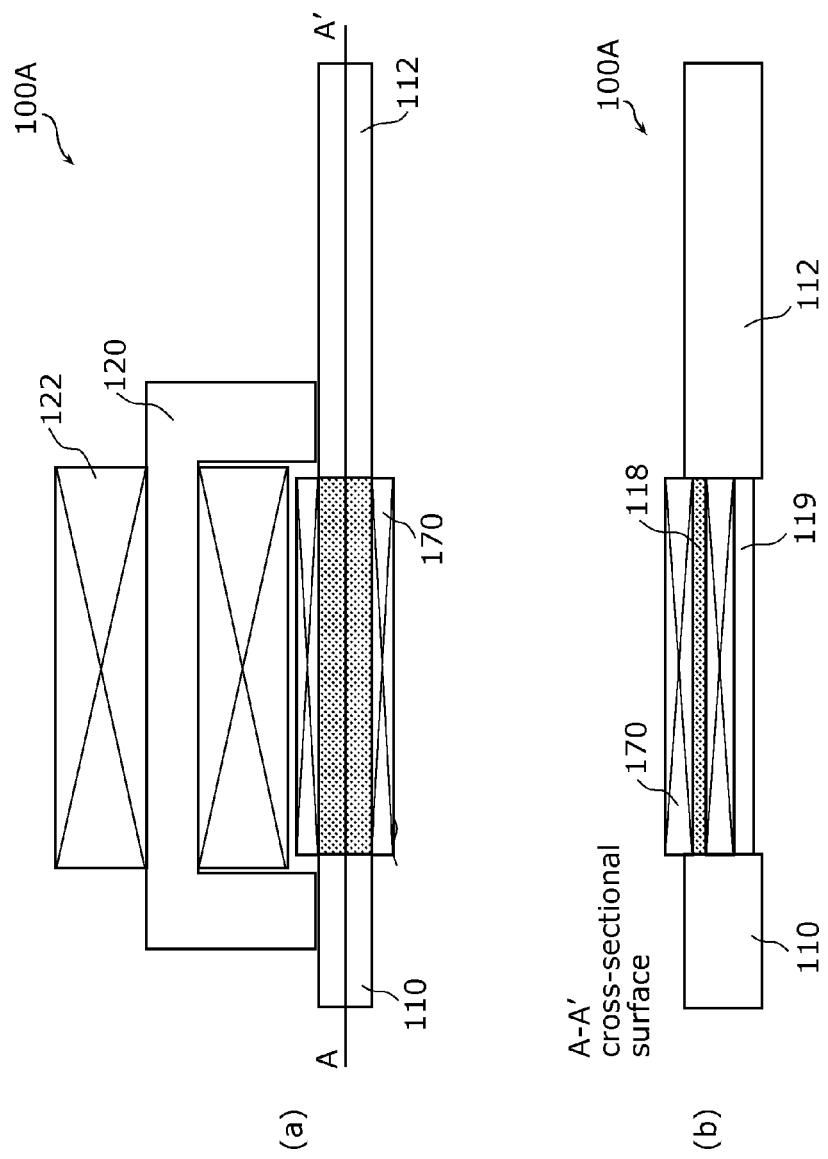
FIG. 6 illustrates views of a structure of the power generating element according to Embodiment 2 of the present invention.
Figure 7:
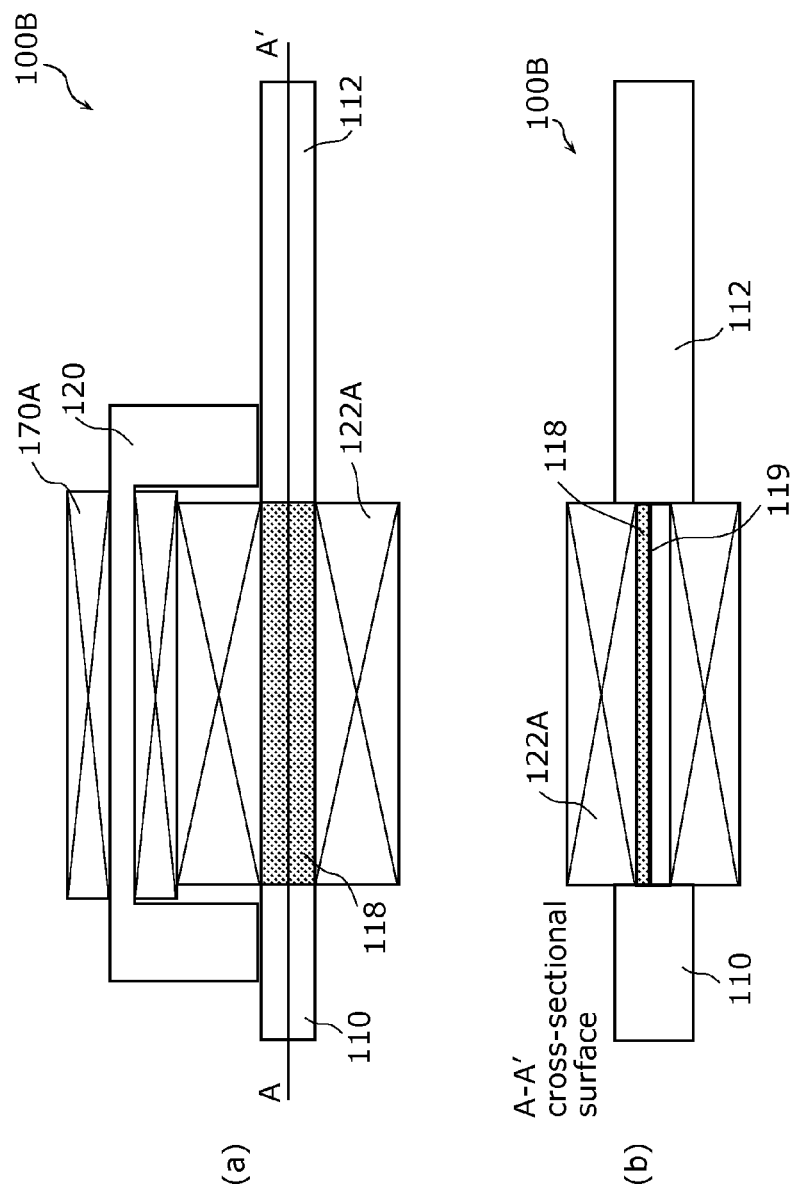
FIG. 7 illustrates views of a structure of a power generating element according to a variation of Embodiment 2 of the present invention.

In Embodiment 1, the magnetic field part includes permanent magnets. However, the magnetic field part may be implemented without using a permanent magnet. With reference to FIGS. 6 and 7, the following describes a structure of a power generating element according to Embodiment 2.

FIG. 6 is a view of a structure of a power generating element 100A according to Embodiment 2 of the present invention. Hereinafter, the description is given mainly for differences between the power generating element 100A according to Embodiment 2 and the power generating element 100 according to Embodiment 1.

(a) in FIG. 6 is a plan view of the power generating element 100A. (b) in FIG. 6 is a cross-sectional view of the power generating element 100A taken along line A-A in (a) in FIG. 6. As seen in (a) and (b) in FIG. 6, the power generating element 100A differs from the power generating element 100 according to Embodiment 1 in that the permanent magnets 114A and 114B and the yoke 116 are not provided, but a coil 170 is wound around at least the magnetostrictive rod 118.

The coil 170 allows the magnetic field part to produce bias magnetic flux. In the power generating device 100A, when a current flows through the coil 170, bias magnetic flux is generated to circulate, passing through the magnetostrictive rod 118, the movable yoke 112, the yoke 120, and the fixed yoke 110. In other words, the coil 170 serves as the magnetic field part. It should be noted that the coil 170 may be wound around both the magnetostrictive rod 118 and the rigid rod 119 which are surface-bonded to each other. In short, the coil 170 is wound around at least the magnetostrictive rod 118.

As described above, the magnetic field part in the power generating element 100A is the coil 170, and the coil 170 is wound around the magnetostrictive rod 118. In the power generating element 100A, when a current flows through the coil 170 wound around the magnetostrictive rod 118, bias magnetic flux occurs in the magnetic field part. Furthermore, in the power generating element 100A, when the magnetostrictive rod 118 is extended or contracted in an axis direction of the magnetostrictive rod 118 (in other words, in a plane including both the magnetostrictive rod 118 and the rigid rod 119), a current flowing through the coil 122 wound around the yoke 120 is taken out to generate power.

As a variation of the power generating element 100A, it is also possible that a coil for power generation is wound around a magnetostrictive rod 118A. This structure is described with reference to FIG. 7.

FIG. 7 illustrates a structure of a power generating element 100B according to a variation of Embodiment 2. Hereinafter, the description is given mainly for differences between the power generating element 100B according to the variation of Embodiment 2 and the power generating element 100A according to Embodiment 2.

(a) in FIG. 7 is a plan view of the power generating element 100B, (b) in FIG. 7 is a cross-sectional view of the power generating element 100B taken along line A-A' in (a) in FIG. 7. As seen in (a) and (b) in FIG. 7, the power generating element 100B differs from the power generating element 100A in that a coil is wound around the surface-contacted magnetostrictive rod 118 and the rigid rod 119 and around the yoke 120. However, a function of each of the coils included in the power generating element 100B is different from the function of the coil provided at the corresponding position in the power generating element 100A.

In the power generating element 100A, the coil 170 wound around the magnetostrictive rod 118 and the rigid rod 119 which are surface-bonded to each other causes bias magnetic flux, and power is taken out from the coil 122 wound around the yoke 120. In other words, the yoke 120 and the coil 122 serve as the power generation part, and the coil 170 serves as the magnetic field part.

On the other hand, in the power generating element 100B, the coil 170A wound around the yoke 120 causes bias magnetic flux, and power is taken out from the coil 122A wound around the magnetostrictive rod 118 and the rigid rod 119 which are surface-bonded to each other.

Here, the coil 122A may be wound around only the magnetostrictive rod 118.

Accordingly, in the power generating element 100B, when a current flows through the coil 170A, bias magnetic flux occurs in the magnetostrictive rod 118 via the yoke 120. In other words, the magnetostrictive rod 118 and the coil 122A serve as the power generation part, and the coil 170A and the yoke 120 serve as the magnetic field part. In the structure, an electromotive force by electromagnetic induction occurs in the coil 122A.

In other words, in the power generating element 100B, the coil 122A is wound around the magnetostrictive rod 118, and the magnetic field part is the first yoke and the coil 170A wound around the first yoke. In the structure, in the power generating element 100B, when a current flows through the coil 170A, bias magnetic flux occurs in the magnetic field part. Here, in the power generating element 100B, it is also possible that, when the magnetostrictive rod 118 is extended or contracted in an axis direction of the magnetostrictive rod (in other words, in a plane including both the magnetostrictive rod 118 and the rigid rod 119), a current flows through the coil 122A wound around the magnetostrictive rod 118 and the current is taken out to generate power.

Like the power generating elements 100A and 100B according to Embodiment 2 and its variation, the structure of generating bias magnetic flux without using a permanent magnet is advantageous in, particularly, increasing a size of the power generating element. This is because it is difficult to manufacture a permanent magnet made of rare earth enabling generation of bias magnetic flux having a strength required for a large power generating element, and to provide such a permanent magnet to the power generating element. The function of the coils 170 and 170A is similar to the function of field coils used in common power generators.

(Other Variations)

Although the description has been given for the power generating elements according to Embodiments 1 and 2 of the present invention, the present invention is not limited to these embodiments. The following describes power generating elements according to the other variations of the embodiments 1 and 2 of the present invention.

In Embodiment 1, the magnetostrictive rod 118 and the rigid rod 119 are surface-bonded to each other. However, as described above, the magnetostrictive rod 118 and the rigid rod 119 may be parallel beams having a gap between them. Furthermore, as illustrated in FIG. 8, it is also possible to inject a filler in the gap between the parallel beams.

Figure 8:
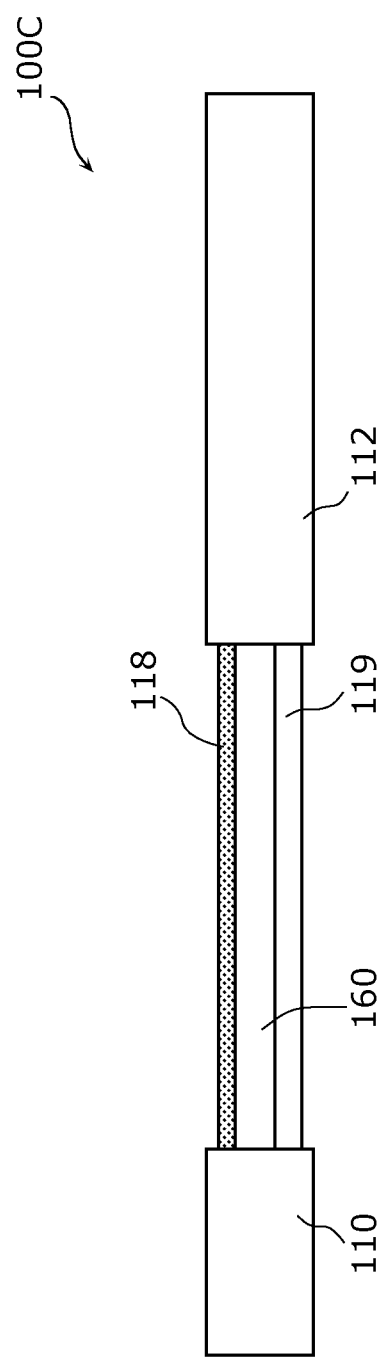
FIG. 8 is a view of a structure of a power generating element with a filler injected between a magnetostrictive rod and a rigid rod which from parallel beams.

FIG. 8 illustrates a structure of a power generating element 100C with a filler 160 injected between the magnetostrictive rod 118 and the rigid rod 119 which from parallel beams. It should be noted that FIG. 8 corresponds to the cross-sectional view taken along line A-A' in (a) in FIG. 2.

As seen in FIG. 8, in the power generating element 100C, the magnetostrictive rod 118 and the rigid rod 119 are arranged in parallel to each other with a gap. In the gap, the filler 160 is injected to fill the gap. The injection of the filler 160 can suppress concentration of stress on a root portion of the magnetostrictive rod 118 which is caused by vibration of the movable yoke 112. It is thereby possible to prevent damage on the portion where the connecting yoke is connected to the magnetostrictive rod 118 and the rigid rod 119.

It should also be noted that, as the power generating element according to another variation of the embodiments 1 and 2 of the present invention, the magnetostrictive rod may be replaced by a magnetostrictive plate that is a magnetostrictive element in a plate shape. The following describes the variation in more detail with reference to FIGS. 9A to 9C.

Figure 9A:
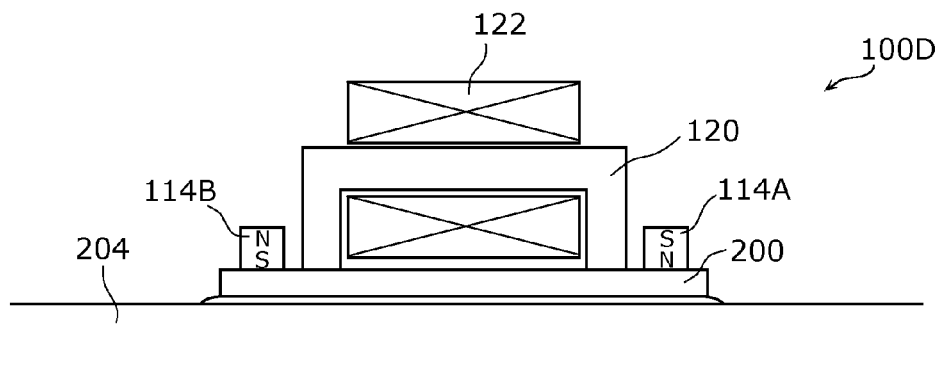
FIG. 9A is a view of an example of a power generating element including a vibration plate.
Figure 9B:
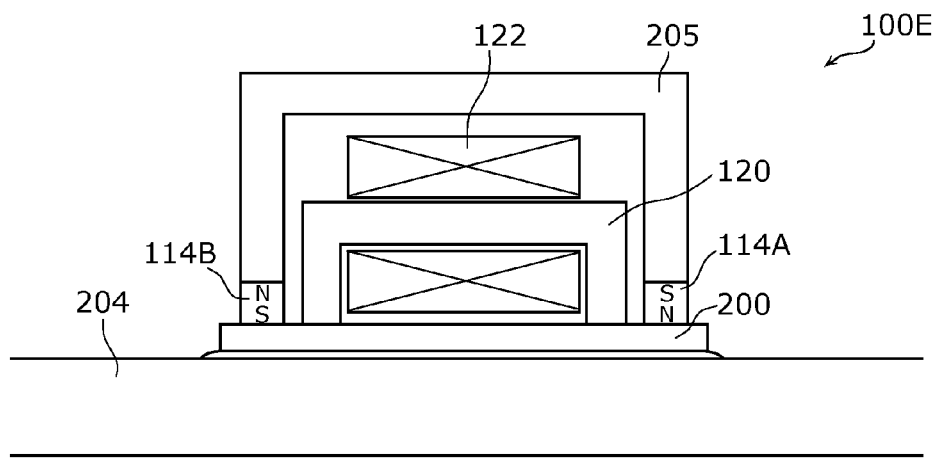
FIG. 9B is a view of another example of a power generating element including a vibration plate.

The power generating element 100D illustrated in FIG. 9A includes: a magnetostrictive plate 200 including a magnetostrictive material; a yoke 120 around which the coil 122 is wound and which has a U shape with two ends magnetically connected to a surface of the magnetostrictive plate 200; permanent magnets (magnetic field parts) 114A and 114B that generate bias magnetic flux circulating through the yoke 120 from one end of the yoke 120 to the other end of the yoke 120. The magnetostrictive plate 200 is surface-bonded to a structural body 204. Here, the structural body 204 is assumed to be a non-magnetic material structure large enough to vibrate the magnetostrictive plate 200.

Here, when the structural body 204 vibrates (extends and contracts), the magnetostrictive plate 200 extends and contracts according to the vibration, thereby applying a stress homogeneously on the magnetostrictive plate 200. The inverse magnetostriction effect caused by the extension and contraction of the magnetostrictive plate 200 changes magnetization in the magnetostrictive plate 200. This change causes a change of the magnetic flux in the yoke 120, thereby causes a current to flow through the coil 122, and eventually a voltage is generated at both ends of the coil 122. It is also possible, as the power generating element 100E illustrated in FIG. 9B, to further provide a yoke 205 that is a back yoke magnetically connecting the magnetic field parts (permanent magnets) 114A and 114B to each other. This structure can reduce a size of the permanent magnets for the magnetic field parts 114A and 114B.

In the same manner as described for the power generating elements 100D and 100E, the power generating element including the magnetostrictive plate is capable of adding a power generation function to the structural body 204 without changing the structure of the existing structural body 204. Here, the yoke 120, which is the power generation part and wound with the coil 122, is physically dependent from the magnetostrictive plate 200. Therefore, it is possible to increase the number of turns in the coil 122, thereby generating a high voltage even from vibration at a low frequency. Furthermore, in the same manner as described for the power generating elements 100D and 100E, the power generating element including the magnetostrictive plate converts vibration energy to power, serving also as a damper suppressing the vibration of the structural body 204.

Figure 9C:
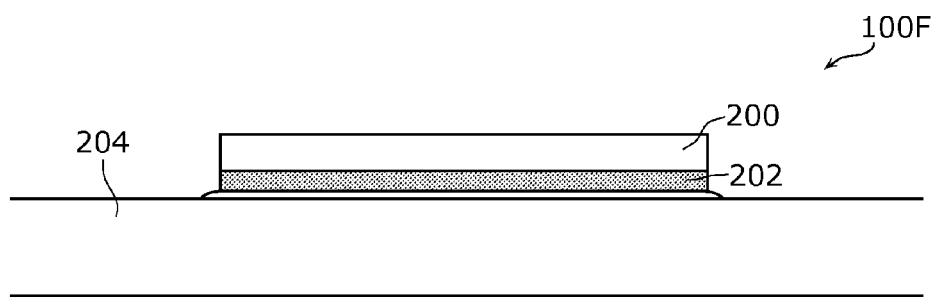
FIG. 9C is a view of still another example of a power generating element including a vibration plate.

If the structural body 204 is made of a material having a magnetic property, as illustrated in FIG. 9C, the structural body 204 is surface-bonded to a member 202 including a non-magnetic material, and the member 202 is surface-bonded to the magnetostrictive plate 200. As a result, a power generating element 100F can offer the same effects as described above. It should be noted that the power generating element 100F illustrated in FIG. 9C shows only the magnetostrictive plate 200 among the structural elements included in the power generating element 100D.

More specifically, in the power generating element 100F, between the structural body 204 and the magnetostrictive plate 200, there is the non-magnetic member 202 having an appropriate thickness enough to propagate deformation and enough to prevent the structural body 204 and the magnetostrictive plate 200 from magnetically interfering each other. In order to deform only the power generating element 100F, the power generating element 100F needs to be firmly jointed to the non-magnetic structural body 204 having an enough thickness in comparison to a thickness of the power generating element 100F (in other words, the power generating element 100F needs to be firmly jointed to the structural body via a non-magnetic material if the structural body is a magnetic material). Thereby, it is considered that stress distribution in the power generating element 100F extending or contracting is homogeneous. As described above, if the non-magnetic member 202 is surface-bonded to the structural body 204, it is possible to provide the structural body 204 that is non-magnetic to the magnetostrictive plate 200.

Furthermore, for practical purposes, the structural body 204 may be various things larger than the thickness of the power generating element. For example, the structural body 204 may be a body frame of transport machinery such as a vehicle and a train, a housing of vibrating machine, motor, or the like, a door, a glass window, a sash, a bridge, a post of a building, and the like.

Embodiment 3

The following describes a power generating element according to Embodiment 3 of the present invention.

Figure 10:
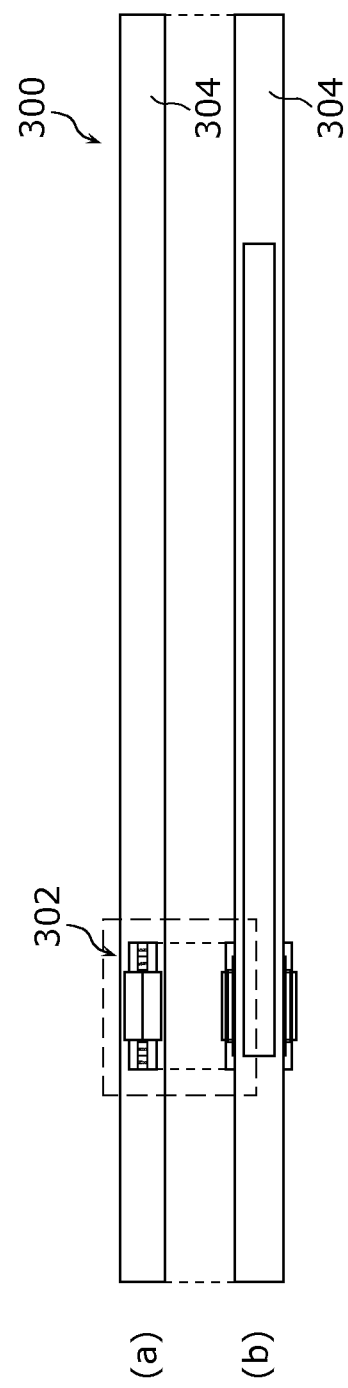
FIG. 10 illustrates views of a structure of a power generating element according to Embodiment 3.
Figure 11:
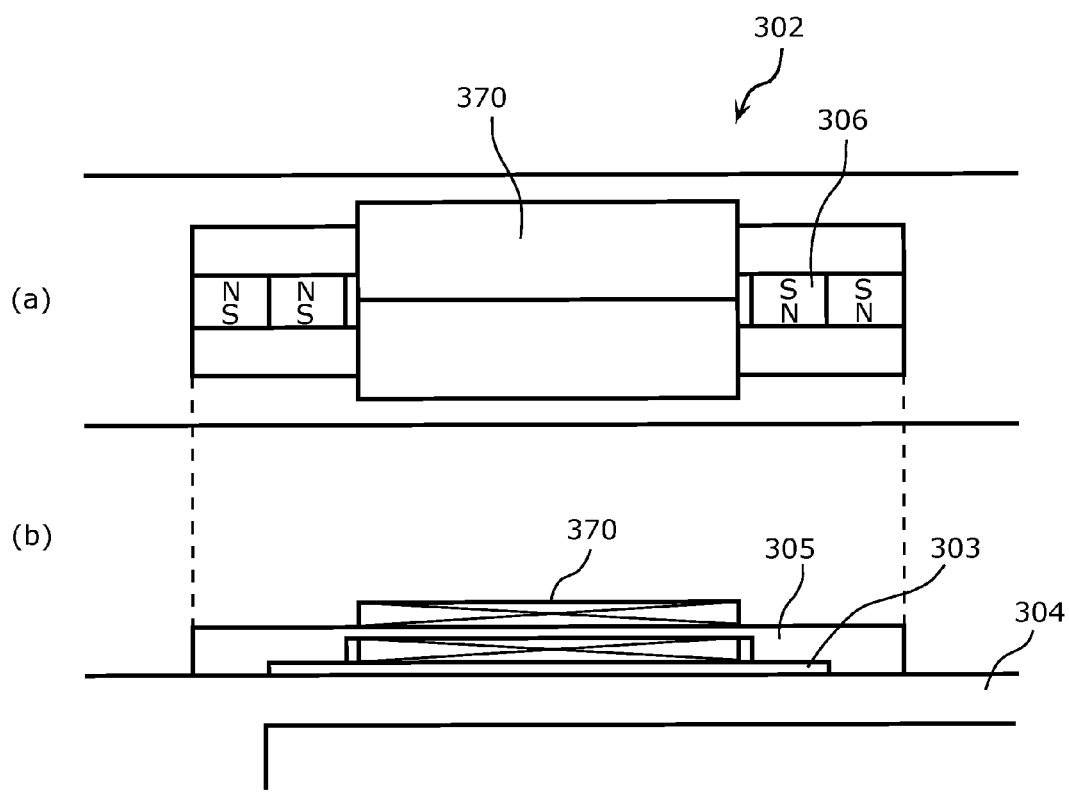
FIG. 11 illustrates enlarged views of a part of the power generating element illustrated in FIG. 10.
Figure 12:
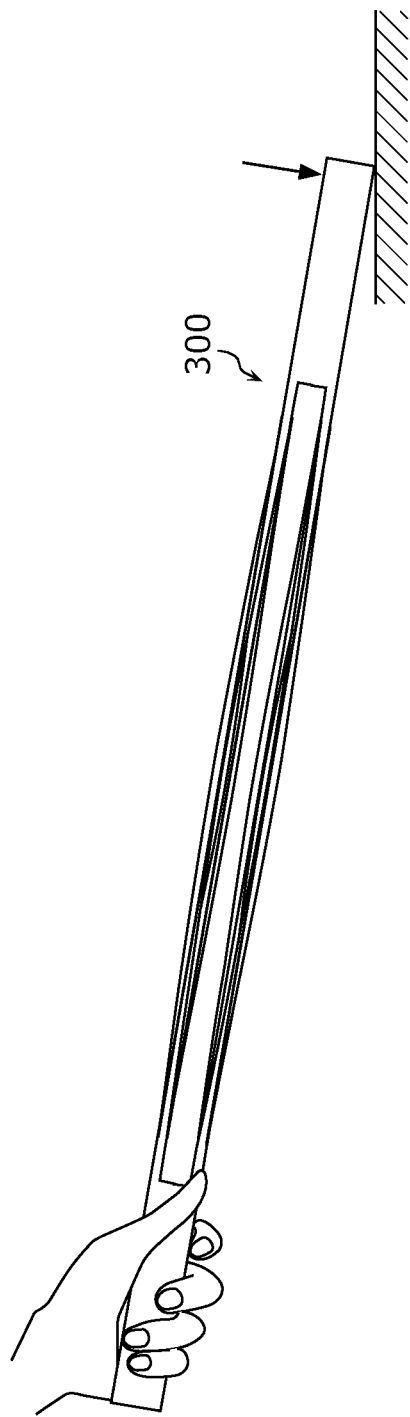
FIG. 12 is a view for explaining an operation of the power generating element according to Embodiment 3.

FIG. 10 illustrates views of a structure of the power generating element according to Embodiment 3. FIG. 11 illustrates enlarged views of a part of the power generating element illustrated in FIG. 10. FIG. 12 is a view for explaining an operation of the power generating element according to Embodiment 3.

The power generating element according to the present embodiment includes a magnetostrictive plate and a yoke. The magnetostrictive plate is surface-bonded to a non-magnetic structural body. In other words, as illustrated in (a) in FIG. 10, the power generating element according to the present embodiment includes power generators 302 and a structural body 304.

Each of the power generators 302 is a coil-separate attachable power generator in which at least one of ends of a yoke around which a coil is wound is not jointed to a magnetostrictive plate (the magnetostrictive rod in Embodiment 1), in the same manner as described for the power generating element 100 described in Embodiment 1. As seen in (b) in FIG. 11, each of the generators 302 includes two structures arranged in parallel, and each of the structures includes: a magnetostrictive plate 303 surface-contacted on the structural body 304; a yoke 305 having a U shape arranged above the magnetostrictive plate 303; and a coil 370 wound around the yoke 305. The magnetostrictive plate 303 has a plate shape and includes a magnetostrictive material. As illustrated in (b) in FIG. 10, the magnetostrictive plate 303 is firmly surface-bonded to a root portion of a corresponding one of the parallel beams in the structural body 304. The yoke 305 is arranged above the magnetostrictive plate 303. One end of the yoke 305 is jointed to the structural body 304.

The structural body 304 includes a non-magnetic material such as aluminum, Carbon Fiber Reinforced Plastics (CFRP), phosphor bronze, or stainless steel. As long as it is possible to provide the power generators 302 to the structural body 304, the structural body 304 may have any shape, such as a plate shape, a rod shape, or a complicated shape like a vehicle body frame. For example, if the power generators 302 are used as power generating elements for a cane, the power generators 302 are provided to the structural body 304 in a rod shape forming a cane. When a user holds one end of the structural body 304 and waves it, or when the user holds one end of the structural body 304 and hits the ground by the other end of the structural body 304, the cane vibrates and generates power.

Furthermore, in order to efficiently generate power, as illustrated in (b) in FIG. 10, the structural body 304 may include parallel beams which are two thin and long beams arranged in parallel. A fixing part is provided to ends of the parallel beams and another fixing part is provided to the other ends of the parallel beams, thereby connecting the two beams in parallel.

In this case, as illustrated in (a) in FIG. 11, in each of the power generators 302, bias magnets 306 are provided between the two magnetostrictive plates 303 arranged in parallel. The bias magnets 306 are the magnetic field part in the present invention. The provision of the bias magnets 306 causes bias magnetic flux and therefore generates magnetic field lines penetrating the two coils 370.

As seen in FIG. 12, the power generating element 300 causes vibration of the parallel beams, when, for example, the user holds one end of the power generating element 300 and waves it, or when the user holds one end of the power generating element 300 and hits the ground by the other end of the power generating element 300. If each of the beams is deformed due to the vibration of the parallel beams, each of the magnetostrictive plates 303 which is surface-bonded to a corresponding one of the beams is also deformed. As a result, magnetic field lines penetrating each of the coils 370 are changed due to the inverse magnetostriction effect. According to the change of the magnetic field lines, the power generators 302 generates a voltage.

The vibrated beams vibrate at a high resonant frequency. The facing beams exert tuning-fork vibration, vibrating in opposite directions to come closer to or move farther away from each other. As a result, the parallel beams keep vibrating for a long time. Therefore, the vibration of the structural body 304 enables the power generators 302 to generate a high voltage and to keep the power generation for a long time. In addition, the vibration deforms the beams greatly at their root portions, so that the provision of the power generators 302 at the respective roots of the beams can increase a power generation amount.

Although it has been described in the present embodiment that the structural body 304 includes the total two power generators 302, providing one power generator 302 to one surface of a root portion of one of the parallel beams, the number of the provided power generators 302 is not limited to the above. For example, it is also possible that the structural body 304 includes total four power generators 302, by providing one power generator 302 to one of two surfaces of each of the root portions of the parallel beams.

Although it has been described in the present embodiment that the power generators 302 are arranged at the root portions of the parallel beams, the power generators 302 may be arranged at other positions.

Embodiment 4

Figure 13:
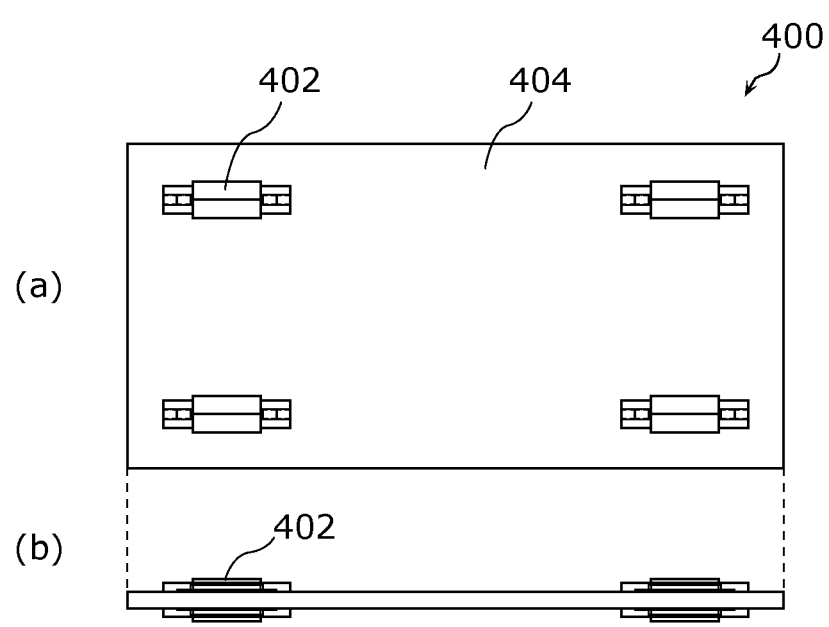
FIG. 13 is a view of a structure of a power generating element according to Embodiment 4.

Next, the description is given for a power generating element according to Embodiment 4 of the present invention. FIG. 13 illustrates a structure of the power generating element according to the present embodiment.

As illustrated in FIG. 13, the power generating element 400 according to the present embodiment has a structure in which four power generators 402 are surface-contacted on a flat plate 404.

The flat plate 404 includes a non-magnetic material, such as aluminum, CFRP, phosphor bronze, or stainless steel. As seen in FIG. 13, the flat plate 404 has a size enough to arrange two or more the power generators 402 in series in a long-side direction or in a short-side direction of the power generators 402.

The structure of each of the power generators 402 is the same as that of the power generators 302 described in Embodiment 3. Each of the power generators 402 consists of two structures arranged in parallel. Each of the two structures includes: a magnetostrictive plate surface-contacted on the flat plate 404; a U-shaped yoke; and a coil wound around the yoke. Furthermore, there are bias magnets between the two magnetostrictive plates arranged in parallel.

Each of the power generators 402 is a coil-separate attachable power generator. In each of the power generators 402, one end of the yoke around which a coil is wound is jointed to the flat plate 404, and the other end of the yoke is not jointed to the flat plate 404. Furthermore, the power generators 402 are arranged in the same direction at four positions (four corners) on the flat plate 404.

With the above structure, when, for example, knocking the flat plate 404, vibration occurs and deforms the flat plate 404 to generate power.

Furthermore, the positions at which the power generators 402 are provided on the flat plate 404 are preferably determined as positions causing great deformation due to resonant in consideration of conditions for confining the flat plate 404 (fixing method, simple supporting, supporting methods such as one-end support and both-end support, and the like). Thereby, the power generating element 400 can efficiently generate power.

It should be noted that it has been described in the present embodiment that the power generators 402 are arranged in the same direction at four positions (four corners) on the flat plate 404. However, it is also possible to change the positions and the arrangement directions of the power generators 402 on the flat plate 404, thereby generating power from vibration of the plural positions and vibration in the plural directions.

Moreover, although it has been described in the present embodiment that the power generators 402 are arranged at four positions on the surface of the flat plate 404, the number of the power generators 402 is not limited to four. For example, it is also possible that there are total eight power generators 402 on the flat plate 404, providing four power generators 402 on each of both surfaces of the flat plate 404. It is also possible that the plurality of power generators 402 are arranged in matrix on the overall surface of the flat plate 404.

Although it has been described in the present embodiment that the shape of the flat plate 404 is a rectangle, the shape of the flat plate 404 is not limited to this but may be, for example, a circle or any other shape.

Embodiment 5

Figure 14:
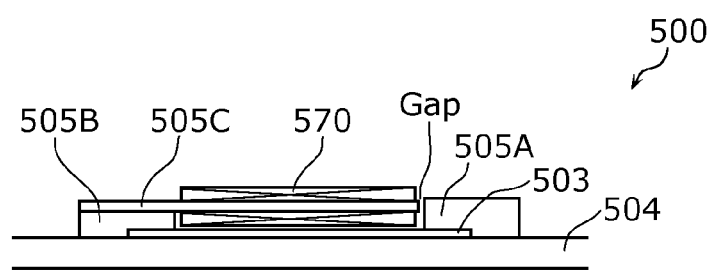
FIG. 14 is a view of a structure of a power generating element according to Embodiment 5.
Figure 15:
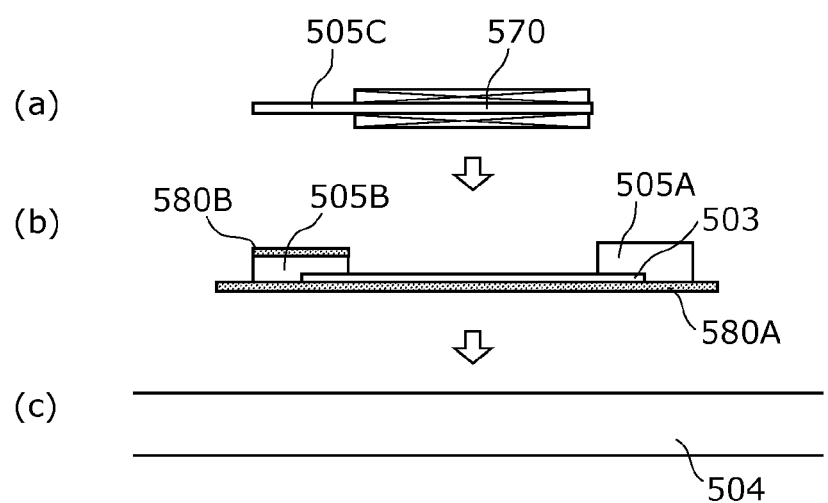
FIG. 15 illustrates views of the structure of the power generating element according to Embodiment 5.

Next, the description is given for a power generating element according to Embodiment 5 of the present invention. FIGS. 14 and 15 illustrate the structure of the power generating element according to the present embodiment.

As illustrated in FIG. 14, the power generating element 500 according to Embodiment 5 includes magnetostrictive plate 503, yokes 505A, 505B, and 505C, and a coil 570 wound around the yoke 505C, and bias magnets (not shown) on a structural body 504.

The structural body 504 includes a non-magnetic material, such as aluminum, CFRP, phosphor bronze, or stainless steel, in the same manner as described in Embodiment 3. The magnetostrictive plate 503 is surface-contacted on the structural body 504. It should be noted that the shape of the structural body 504 may be the parallel-beam structure as described in Embodiment 3, or the flat plate as described in Embodiment 4.

As illustrated in FIG. 14, each of the yokes 505A and 505B is arranged on the structural body 504 and the magnetostrictive plate 503. In other words, the magnetostrictive plate 503 surface-contacted on the structural body 504 has one end fixed to the structural body 504 and the yoke 505A, and the other end fixed to the structural body 504 and the yoke 505B.

One end of the yoke 505C is arranged on the yoke 505B. The coil 570 is wound around on a part of the yoke 505C which is not connected to the yoke 505B. Furthermore, the yoke 505C and the yoke 505A are not jointed together, and there is a gap between the yoke 505C and yoke 505A. The gap is determined to have a width enough to prevent that a magnetic resistance is greater than magnetic flux passing through the yokes 505A, 505B, and 505C, and the magnetostrictive plate 503. There is also a gap between the coil 570 wound around the yoke 505C and the magnetostrictive plate 503.

FIG. 15 illustrates the structure of the power generating element 500 in more detail. As illustrated in (b) in FIG. 15, on an adhesive sheet 580A, the magnetostrictive plate 503, the yoke 505A, and the yoke 505B are previously provided at predetermined positions. On the yoke 505B, another adhesive 580B is provided. Then, on the structural body 504 illustrated in (c) in FIG. 15, the magnetostrictive plate 503, the yoke 505A, and the yoke 505B illustrated in (b) in FIG. 15 are arranged via the adhesive sheet 580A. Furthermore, the yoke 505C wound with the coil 570 illustrated in (a) in FIG. 15 is arranged on the yoke 505B via the adhesive 580B.

The adhesive sheet 580A protects the surface of the magnetostrictive plate 503, before the magnetostrictive plate 503 is adhered to the structural body 504. The adhesive sheet 580A includes, for example, photocrosslinkable or thermoset resin. When the magnetostrictive plate 503 is adhered to the structural body 504, the adhesive sheet 580A is applied with light or heat to be hardened by chemical reaction, thereby causing the magnetostrictive plate 503 and the structural body 504 to adhere to each other. A thickness of the adhesive sheet 580A after the magnetostrictive plate 503 and the structural body 504 adhere to each other is thin enough to sufficiently propagate deformation of the structural body 504 to the magnetostrictive plate 503.

Furthermore, like the adhesive sheet 580A, the adhesive 580B includes an optical or thermoset resin. When the yoke 505C is adhered to the yoke 505B, the adhesive 580B is applied with light or heat to be hardened by chemical reaction, thereby causing the yoke 505B and the yoke 505C to adhere to each other. Therefore, it is possible to easily form the power generators (each including the magnetostrictive plate 503, the yokes 505A, 505B, and 505C, and the coil 570) on the structural body 504.

With the above structure, in the power generating element 500, the yoke 505C does not deform from vibration of the structural body 504. Furthermore, in comparison to the structure in which the yoke 505C sticks to the yoke 505A by a magnetic force, the power generating element 500 causes less friction between the yoke 505A and the yoke 505C, thereby reducing an attenuation loss of vibration. Therefore, the power generating element 500 can keep vibrating for a long time, thereby keeping power generation from the vibration for a longer time.

Furthermore, the power generating element 500 can be manufactured only by preparing the structural body 504 and the magnetostrictive plate 503 on the adhesive sheet 580A, and then adhering the adhesive sheet 580A to the structural body 504. It is therefore possible to easily manufacture the power generating element 500.

Embodiment 6

Figure 16A:
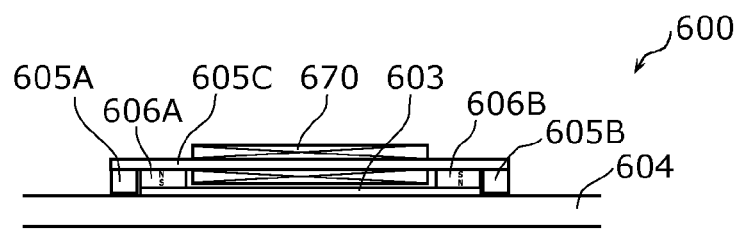
FIG. 16A is a view of a structure of a power generating element according to Embodiment 6.
Figure 16B:
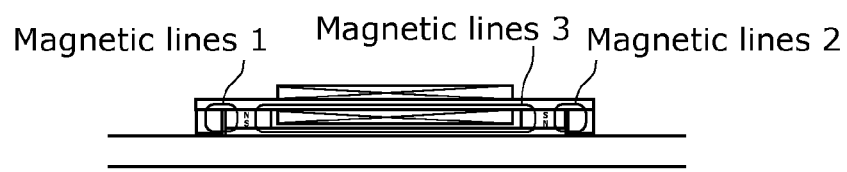
FIG. 16B is a view for explaining magnetic field lines occurred in the power generating element illustrated in FIG. 16A.
Figure 16C:
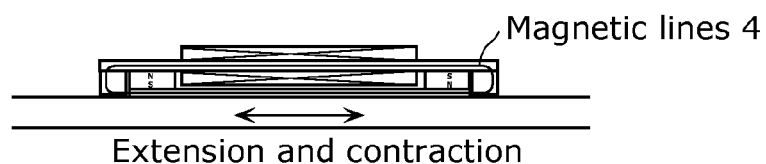
FIG. 16C is a view for explaining magnetic field lines occurred in the power generating element illustrated in FIG. 16A.

Next, the description is given for a power generating element according to Embodiment 6 of the present invention. FIG. 16A is a view of a structure of the power generating element according to Embodiment 6. FIGS. 16B and 16C are views for explaining magnetic field lines occurred in the power generating element illustrated in FIG. 16A.

As illustrated in FIG. 16A, a power generating element 600 according to Embodiment 6 includes: a magnetostrictive element (magnetostrictive plate or magnetostrictive rod) 603 provided on a structural body 604; yokes 605A and 605B provided on the structural body 604; a yoke 605C provided on the yokes 605A and 605B; a coil 670 wound around the yoke 605C; and bias magnets 606A and 606B each connected to the magnetostrictive element 603 and the yoke 605C.

The bias magnet 606A is arranged at one end of the magnetostrictive element 603, and the bias magnet 606B is arranged at the other end of the magnetostrictive element 603, so that their magnetic pole directions are opposite. The yoke 605A is in contact with the bias magnet 606A, and the yoke 605B is in contact with the bias magnet 606B.

More specifically, the power generating element 600 includes: a yoke 605C arranged in parallel to the magnetostrictive element 603; a yoke 605A having a portion connected to one end portion of the yoke 605C and a portion connected to one end portion of the magnetostrictive element 603; and a yoke 605B having a portion connected to the other end portion of the yoke 605C and a portion connected to the other end portion of the magnetostrictive element 603. Furthermore, the power generating element 600 also include: a bias magnet 606A provided close to the yoke 605A and connected to one end portion of the yoke 605C and one end portion of the magnetostrictive element 603; and a bias magnet 606B provided close to the yoke 605B and connected to the other end portion of the yoke 605C and the other end portion of the magnetostrictive element 603, thereby causing magnetic flux passing through the yokes 605C, 605A, and 605B, and the magnetostrictive element 603. Here, one end portion or the other end portion of the yoke 605C is a part from one end or the other end of the yoke 605C to a position wound with the coil 670. One end portion and the other end portion of the magnetostrictive element 603 are parts of the facing magnetostrictive element 603 which face the yoke 605C.

With the above structure, a magnetic field line loop 1 occurs in the power generating element 600 as illustrated in FIG. 16B, passing through the bias magnet 606A, the yokes 605C and 605A, and the magnetostrictive element 603. Furthermore, a magnetic field line loop 2 occurs, passing through the bias magnet 6063, the magnetostrictive element 603, and the yokes 605B and 605C. Moreover, a magnetic field line loop 3 occurs, passing through the bias magnet 606A, the yoke 605C, the bias magnet 6063, and the magnetostrictive element 603.

Here, as illustrated in FIG. 16C, when the structural body 604 extends and contracts, the magnetostrictive element 603 on the structural body 604 also extends and contracts, thereby changing magnetization in the magnetostrictive element 603 due to the inverse magnetostriction effect. The magnetization change causes a magnetic field line loop 4 passing through the magnetostrictive element 603 and the yokes 605A, 6053, and 605C. The temporal change of the magnetic field line loop 4 is taken out as an electromotive force of the coil 670, thereby efficiently generating power to increase a power generation amount.

With the above structure, it is not necessary to provide the plurality of bias magnets 306 between the two magnetostrictive plates 303 arranged in parallel as illustrated in FIG.

11. Since the bias magnets 606A and 606B are embedded in a magnetic circuit formed by the magnetostrictive element 603 and the yoke 605C, bias magnetic flux (magnetization) is efficiently generated in the magnetostrictive element 603 to generate power.

To utilize this principle, in other words, in order to generate appropriate bias magnetic flux (magnetic field line loop 3) in the magnetostrictive element 603 and take out a current, which depends on a change of the magnetization in the magnetostrictive element 603 in the magnetic field line loop 4, from the coil 670 wound around the yoke 605C, each of the yokes 605A and 605B which the magnetic field lines penetrate needs to have an appropriate size of a cross-sectional area. For example, if the cross-sectional area of each of the yokes 605A and 605B which the magnetic field lines penetrate is too large, most of the magnetic field lines generated by the bias magnets 606A and 606B form (a) a loop such as the magnetic field line loop 1 illustrated in FIG. 16B, passing through the bias magnet 606A, the yoke 605A, the yoke 605C, and the magnetostrictive element 603, and (b) a loop such as the magnetic field line loop 2 illustrated in FIG. 16B, passing through the bias magnet 606B, the magnetostrictive element 603, the yoke 605B, and the yoke 605C, but the magnetic field line loop 3 does not occur. On the other hand, if the cross-sectional area of each of the yokes 605A and 605B which the magnetic field lines penetrate is small, magnetic saturation occurs in the yokes 605A and 605B which prevents generation of the magnetic field line loop 4. For example, each of the bias magnets 606A and 606B has a cross-sectional area of 6 mm$^2$ in a direction in parallel to the surface of the structural body 604, and each of the yokes 605A and 605B has a cross-sectional area of 8 mm$^2$ in a direction in parallel to the surface of the structural body 604. Here, a length of the yoke 605C is 20 mm.

Furthermore, in order to efficiently generate the magnetic field line loops, it is desirable that the bias magnets 606A and 606B, the yoke 605A, 605B, and 605C, and the magnetostrictive element 603 are in contact with one another without a gap among them. However, the yokes 605A and 605B are not necessarily in contact with the structural body 604. The yokes 605A and 605B may be kept at their positions by sticking of a magnetic force. If vibration of the structural body 604 displaces the yokes 605A and 605B, it is possible that the yokes 605A and 605B are jointed to the structural body 604. The yoke 605C may be stuck by a magnetic force or jointed to the bias magnets 606A and 606B and the yokes 605A and 605B.

Furthermore, in the power generating element 600 illustrated in FIG. 16A, the bias magnets 606A and 606B are arranged between the yoke 605A and the yoke 605B. However, it is also possible that the yokes 605A and 605B are arranged between the bias magnet 606A and the bias magnet 606B.

Figure 16D:
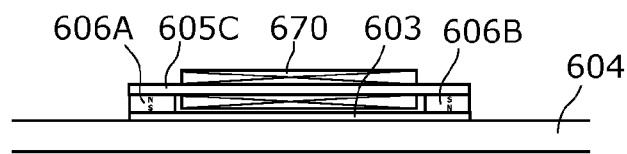
FIG. 16D is a view of a structure of a power generating element according to a variation of Embodiment 6.
Figure 16E:
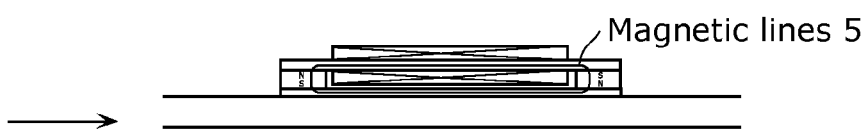
FIG. 16E is a view for explaining magnetic field lines occurred in the power generating element illustrated in FIG. 16D.

Furthermore, the power generating element 600 may be without the yokes 605A and 605B. FIG. 16D is a view of a structure of a power generating element according to a variation of Embodiment 6. FIG. 16E is a view for explaining the magnetic field lines occurred in the power generating element illustrated in FIG. 16D.

As illustrated in FIG. 16D, the power generating element 600 does not include the yokes 605A and 605B in the power generating element 600 illustrated in FIG. 16A. The bias magnet 606A is arranged on the upper surface of one end of the magnetostrictive element 603 provided on the structural body 604, and the bias magnet 606B is arranged on the upper surface of the other one end of the magnetostrictive element 603, so that their magnetic pole directions are opposite.

Around the yoke 605C, the coil 670 is wound. With the above structure, magnetic field lines generated by the magnets 606A and 606B pass through the magnetostrictive element 603, the bias magnets 606A and 606B, and the yoke 605C, thereby forming a magnetic field line loop 5 as illustrated in FIG. 16E. When the structural body 604 is deformed by vibration, the magnetostrictive element 603 extends and contracts, thereby changing the magnetization inside the magnetostrictive element 603. The change of the magnetization causes a current (voltage) in the coil 670, and thereby generates power.

Figure 16F:
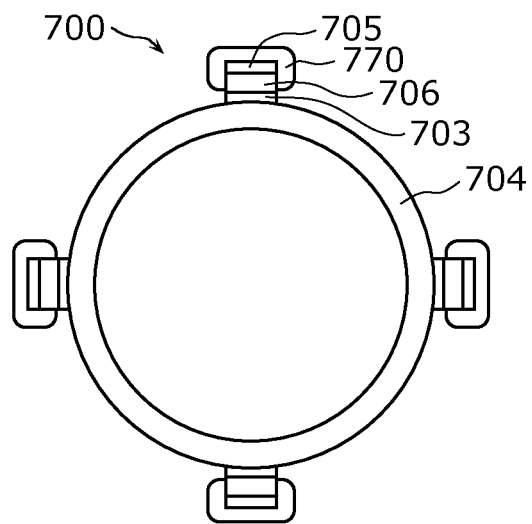
FIG. 16F is a view of a structure of a power generating element in which power generation materials are provided to a cylindrical structural body.

It should be noted that the power generating element is not limited to have the structure in which the power generators are arranged on the planar structural body, but may have a structure in which the power generators are arranged on a column-shaped or cylindrical structural body. FIG. 16F is a view of a structure of a power generating element in which power generators are arranged on a cylindrical structural body. In FIG. 16F, the power generating element is viewed from a direction indicated by an arrow illustrated in FIG. 16E.

As illustrated in FIG. 16F, a power generating element 700 has four power generators on the outer side surface of a cylindrical structural body 704 at respective circle central angles of 90 degrees of a circle. The power generating element 700 includes: a magnetostrictive element (magnetostrictive plate or magnetostrictive rod) 703 arranged on the structural body 704; two bias magnets 706 arranged on the magnetostrictive element 703; and a yoke 705 arranged on the two bias magnets 706; and a coil 770 wound around the yoke 705.

One of the two bias magnet 706 is arranged on the upper surface of one end of the magnetostrictive element 703, and the other bias magnet 706 is arranged on the upper surface of the other end of the magnetostrictive element 703, so that their magnetic pole directions are opposite. The yoke 705 is in contact with the two bias magnets 706. The yoke 705 may be jointed to the two bias magnets 706, or may be stuck by a magnetic force.

The magnetic field line loop occurred in the power generating element 700 is the same as the magnetic field line loop 5 occurred in the power generating element 600 illustrated in FIG. 16E. More specifically, in the power generating element 700 in which the magnetostrictive element 703, the bias magnet 706, and the yoke 705 form an in-line magnetic circuit, the single magnetic field line loop 5 occurs and power is generated by a change of magnetic flux of the magnetic field line loop 5. As a result, a size of the entire power generating element 700 can be reduced. Even if the structural body 704 has a curvature on the side surface, such as a column-shaped or cylindrical structural body, it is possible to consider the cylindrical shape as planar by providing small power generators to the structural body.

For example, in the power generating element 700, the magnetostrictive element 703 includes iron gallium alloy, having a length of 20 mm and a cross-sectional area of 2 mm×0.5 mm (1 mm$^3$). The bias magnet 706 includes Nd—Fe—B, having a cross-sectional area of 2 mm×3 mm (6 mm$^3$), and a length of 1 mm in a magnetization direction. The yoke 705 desirably includes a magnetic material having a magnetic permeability as high as possible, having a cross-sectional area of 2 mm×1 mm (2 mm$^3$) and a length of 20 mm.

Examples of the cylindrical or column-shaped structural body 704 are a pipe, a fishing pole, a cane, and the like. Although the power generating element 700 illustrated in FIG. 16F has the structure in which the power generators are provided on the outer side surface of the cylindrical structural body 704, the power generators may be provided on the inner side surface of the cylindrical structural body 704.

Although the description has been given for the power generating elements according to the present embodiments, the present invention is not limited to these embodiments.

Figure 17:
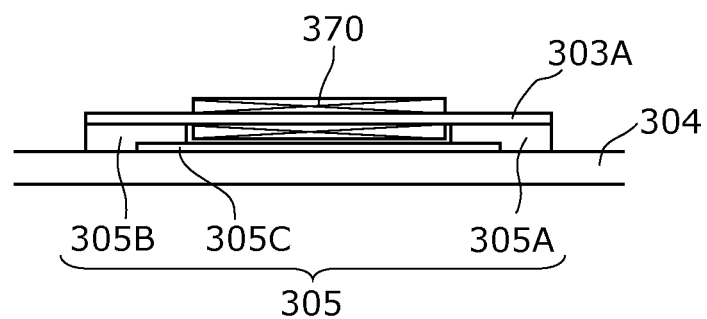
FIG. 17 is a view of a structure of a power generating element according to a variation of the embodiment of the present invention.

For example, in the power generating element 100 according to Embodiment 1, a coil is not wound around the magnetostrictive rod 118. However, it is possible to wind a coil around the magnetostrictive rod 118 included in the power generating element 100. FIG. 17 is a view of a structure of a power generating element according to a variation of the embodiment of the present invention. As illustrated in FIG. 17, in each of the power generators 302 according to Embodiment 3, it is also possible that the coil 370 is not wound around the yoke 305, but a magnetostrictive element 303A is provided on yokes 305A and 305B included in a yoke 305 that consists of yokes 305A, 305B, and 305C which are provided on the structural body 304, and the coil 370 is wound around the magnetostrictive element 303A. In this case, the structural body 304, the yokes 305A and 305B, and the magnetostrictive element 303A need to be firmly jointed together. By winding the coil 370 around the magnetostrictive element 303A, it is possible to increase magnetic flux penetrating the coil 370 to efficiently generate power.

Furthermore, the magnetostrictive rod may be a magnetostrictive material having a column shape, a prismatic column shape, or any desired cylindrical shape. Furthermore, the magnetostrictive rod may be a magnetostrictive material in a plate shape.

Figure 18:
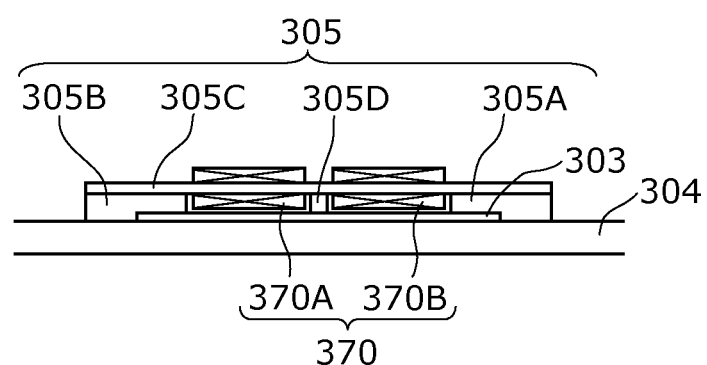
FIG. 18 is a view of a structure of a power generating element according to another variation of the embodiment of the present invention.

The shape of the yoke may be a shape except a U shape, for example, a shape deformed from a U shape. For example, FIG. 18 is a view of a structure of a power generating element according to another variation of the embodiment of the present invention. As illustrated in FIG. 18, it is also possible that the coil 370 illustrated in FIG. 11 consists of two coils 370A and 370B, and the yoke 305 illustrated in FIG. 11 consists not only the yokes 305A, 305B, and 305C but also a yoke 305D which are arranged between the coil 370A and the coil 370B.

The structural body provided with the power generators produces dumping effects for attenuating vibration, when the power generators generate power. Therefore, by accumulating electrical energy generated by power generation of the power generators and causing a current to flow through the coils of the power generators using the accumulated electrical energy, the magnetostrictive element in each of the power generators extends and contracts to cause further vibration. Thereby, each of the generators serves as an actuator, attenuating vibration caused by the outside of the structural body on which the power generator is provided, or causing different vibration for the structure. Therefore, the power generating element is capable of generating power while a vibration amplitude of the structural body is controlled to have a desired magnitude.

It should be noted that in each of the above-described figures, corners and sides of each of the structural elements are linearly shown. However, for the reasons in manufacturing, rounded corners and rounded sides are also possible in the present invention.

In addition, all of the numerical numbers indicated above are examples for explaining the present invention more specifically, and the present invention is not limited to the example numerical numbers.

Furthermore, the above-described embodiments and variations may be combined.

The embodiments disclosed above should be considered as examples in all aspects and not limiting the present invention. The scope of the present invention is based not on the above description but on the claims, and any modifications of the above description are within the equivalent meanings and the scope of the claims.

INDUSTRIAL APPLICABILITY

The present invention can be applied to power generating elements and the like using vibration, and, in particular, to power generating elements and the like which include a magnetostrictive material.

NUMERICAL REFERENCES 100, 100A, 100B, 100C, 100D, 100E, 100F, 300, 400, 500, 600, 700, 900A, 900B power generating element
110, 912 fixed yoke
112, 914 movable yoke
114A, 114B permanent magnet (magnetic field part)
116, 120, 205, 305, 305A, 305B, 305C, 305D, 505A, 505B, 505C, 605A, 605B, 605C, 705, 920 yoke
118, 918A, 918B, 918C magnetostrictive rod
119 rigid rod
122, 122A, 170, 170A, 370, 370A, 370B, 570, 670, 770, 916A, 916B,
916C coil
140 force
150A, 150B bias magnetic flux
152 magnetic flux
160 filler
200, 303, 503, 603, 703 magnetostrictive plate
202 non-magnetic member
204, 304, 504, 604, 704 structural body
302, 402 power generator
306, 606A, 606B, 706 bias magnet (permanent magnet)
404 flat plate (structural body)

The invention claimed is:

1. A power generating element comprising:
  a magnetostrictive plate including a magnetostrictive material;
  a yoke around which a coil is wound, the yoke having a substantial U shape with two ends magnetically connected to a surface of the magnetostrictive plate; and
  a magnetic field part which generates bias magnetic flux circulating through the yoke from one of the two ends of the yoke to an other one of the two ends of the yoke,
  wherein the magnetostrictive plate is surface-bonded to a non-magnetic structural body.

2. The power generating element according to claim 1,
  wherein the yoke includes a first yoke, a second yoke, and a third yoke, the first yoke being in parallel to the magnetostrictive plate, the second yoke having a portion connected to one end portion of the first yoke and an other portion connected to one end portion of the magnetostrictive plate, and the third yoke having a portion connected to an other end portion of the first yoke and an other portion connected to an other end portion of the magnetostrictive plate, and
  the magnetic field part includes a first permanent magnet and a second permanent magnet so as to generate magnetic flux passing through the first yoke, the second yoke, the third yoke, and the magnetostrictive plate, the first permanent magnet being close to the second yoke and connected to one end portion of the first yoke and one end portion of the magnetostrictive plate, and the second permanent magnet being close to the third yoke and connected to an other end portion of the first yoke and an other end portion of the magnetostrictive plate.

3. The power generating element according to claim 1, wherein the non-magnetic structural body includes a pair of parallel beams arranged in parallel to each other, and the magnetostrictive plate is surface-bonded to a root of each of the parallel beams.

4. A power generating element comprising:
a magnetostrictive rod including a magnetostrictive material;
a rigid rod in parallel to the magnetostrictive rod, the rigid rod having a stiffness and a shape for applying a homogeneous compression or tension force to the magnetostrictive rod;
two connecting yokes each provided at a corresponding one of both ends of each of the magnetostrictive rod and the rigid rod so as to physically connect the magnetostrictive rod and the rigid rod to each other;
a first yoke magnetically connecting the two connecting yokes together, the first yoke being wound with a coil; and
a magnetic field part which generates bias magnetic flux circulating through the first yoke from one of the two connecting yokes to an other of the two connecting yokes,
wherein the magnetostrictive rod extends or contracts in an axis direction of the magnetostrictive rod, thereby generating power.

5. The power generating element according to claim 4, wherein the magnetic field part includes a first permanent magnet, a second permanent magnet, and a second yoke, the first permanent magnet sticking to one of the two connecting yokes by a magnetic force, the second permanent magnet sticking to an other one of the two connecting yokes by a magnetic force, and the second yoke magnetically connecting the first permanent magnet and the second permanent magnet to each other, and
the second yoke is stuck to the first permanent magnet and the second permanent magnet by a magnetic force produced by the first permanent magnet and a magnetic force produced by the second permanent magnet.

6. The power generating element according to claim 5, wherein the first yoke is stuck to the two connecting yokes by the magnetic force produced by the first permanent magnet and the magnetic force produced by the second permanent magnet.

7. The power generating element according to claim 4, wherein the first yoke is wound with a first coil that is the coil,
the magnetic field part is a second coil that is wound around the magnetostrictive rod, and a current flows through the second coil wound around the magnetostrictive rod to generate bias magnetic flux in the magnetic field part, and
the power generating element takes out a current flowing through the first coil wound around the first yoke to generate power, the current being caused when the magnetostrictive rod is extended or contracted in the axis direction of the magnetostrictive rod.

8. The power generating element according to claim 4, wherein the magnetostrictive rod is wound with a first coil,
the magnetic field part includes the first yoke and a second coil wound around the first yoke, and a current flows through the second coil to generate bias magnetic flux in the magnetic field part, and
the power generating element takes out a current flowing through the first coil wound around the magnetostrictive rod to generate power, the current being caused when the magnetostrictive rod is extended or contracted in the axis direction of the magnetostrictive rod.

9. The power generating element according to claim 4, wherein the magnetostrictive rod is surface-bonded to the rigid rod.

10. The power generating element according to claim 4, wherein the magnetostrictive rod is not wound with a coil, and
the power generating element takes out a current flowing through the coil wound around the first yoke to generate power, the current being caused when the magnetostrictive rod is extended or contracted in the axis direction of the magnetostrictive rod.

* * * * *